(12) United States Patent
Takeuchi et al.

(10) Patent No.: US 6,396,086 B1
(45) Date of Patent: *May 28, 2002

(54) SEMICONDUCTOR DEVICE AND SEMICONDUCTOR INTEGRATED CIRCUIT HAVING A CONDUCTIVE FILM ON ELEMENT REGION

(75) Inventors: Yuji Takeuchi, Kawasaki; Riichiro Shirota, Fujisawa; Seiichi Aritome, Yokohama; Masashi Umemura, Yokkaichi; Yuuichiro Murahama, Yokkaichi; Hitoshi Araki, Yokkaichi; Masamitsu Yahata; Osamu Ikeda, both of Yokohama, all of (JP)

(73) Assignee: Kabushiki Kaisha Toshiba, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/404,090

(22) Filed: Sep. 23, 1999

(30) Foreign Application Priority Data

Sep. 29, 1998  (JP) ............................................ 10-276045

(51) Int. Cl.⁷ .............................................. H01L 27/10
(52) U.S. Cl. ........................ 257/206; 257/315; 257/316
(58) Field of Search ................................. 257/206, 213, 257/315, 316, 269, 321, 72, 59, 487; 438/128, 129, 201, 211, 257

(56) References Cited

U.S. PATENT DOCUMENTS

| 5,504,706 A | * | 4/1996 | D'Arrigo | 257/315 |
| 5,923,063 A | * | 7/1999 | Liu | 257/316 |
| 5,925,906 A | * | 7/1999 | Tanaka | 257/314 |
| 5,966,601 A | * | 10/1999 | Ling | 257/315 |
| 6,121,655 A | * | 9/2000 | Odanaka | 257/315 |

FOREIGN PATENT DOCUMENTS

| JP | 10-22403 | 1/1998 |
| JP | 11-26728 | 1/1999 |

* cited by examiner

Primary Examiner—Olik Chaudhuri
Assistant Examiner—Nathan W. Ha
(74) Attorney, Agent, or Firm—Hogan & Hartson, L.L.P.

(57) ABSTRACT

In a semiconductor device of MOS structure, the element region has a shape such as a square shape which has a plurality of sides and a plurality of corners. On the element region, a conductive film which constitutes one electrode of the MOS structure is formed. The other electrode of the MOS structure is a silicon substrate. The conductive film is provided so as to cover at least sides adjacent to each other and so as not to cover the corners including the corners which are the contact points (intersecting points) of the adjacent sides. Further, in case the element region is in a ring shape, the conductive film is provided so as to cover none of the corners including the inside corners of the ring-shaped element region. By the above-mentioned structure, the occurrence of breakdown in the insulation film in the MOS structure can be prevented, and the reliability thereof can be enhanced.

54 Claims, 17 Drawing Sheets

SEMICONDUCTOR DEVICE AND SEMICONDUCTOR INTEGRATED CIRCUIT HAVING A CONDUCTIVE FILM ON ELEMENT REGION

BACKGROUND OF THE INVENTION

The present invention relates to a semiconductor device which comprises a conductive film formed extending over an element isolation region and an element region 11 and has in the element region 11 a capacitor structure comprised of a semiconductor substrate, an insulating layer, and the conductive layer and, more particularly, to a semiconductor device used for MOSFET or MOS capacitor.

FIG. 31 shows an example of the shape of a conventional MOS capacitor. FIG. 32 is a sectional view taken along the line XXXII—XXXII in FIG. 31.

On a silicon substrate 10, an element isolating insulation film 12 having an STI (Shallow Trench Isolation) structure is formed. The element isolating insulation film 12 constitutes an element isolation region, defining an element region 11 in the silicon substrate 10. The element region 11 has a square shape which has four sides and four corners.

In the substrate 10 within the element region 11, there is formed a diffusion layer 13 which has the same conductivity type as that of the silicon substrate 10 and has an impurity concentration higher than that of the silicon substrate 10. Connected to the diffusion layer, 13 is a wiring 14 which is provided for setting a potential of the silicon substrate 10.

A silicon oxide film 15 is formed on the substrate 10 within the element region 11. Further, a conductive film 16 is formed on the element isolating insulation film 12 and on the silicon oxide film 15. The conductive film 16 is composed of a metal, a semi-conductor containing an impurity, or the like. The conductive film 16 is formed extending over the element separation region and the element region 11, and, in the element region 11, a capacitor structure is formed which is comprised of the silicon substrate 10, the silicon oxide film 15 and the conductive film 16. Further, the conductive film 16 covers three sides S1, S2, and S3 and two corners C1 and C2 of the element region 11.

An interlayer insulation film (such as a TEOS film or a BPSG film) 17 is formed on the conductive film 16. The wiring 14 and a wiring 18 are formed on the interlayer insulation film 17. The wiring 14 is connected to the diffusion layer 13 via a contact hole 19, and the wiring 18 is connected to the conductive film 16 via a contact hole 20.

In the MOS capacitor having the above-mentioned structure, the conductive film 16 covers three sides S1, S2, and S3 and two corners C1 and C2 of the element region 11. This is for assuring the maximum capacitor area even if a misalignment takes place when the patterning of the conductive film 16 is made.

However, such a structure has a disadvantage that, in case that a voltage is applied across the silicon substrate 10 and the conductive film 16, the electric field concentrates in the sides S1, S2, and S3 and corners C1 and C2 of the element region 11 covered by the conductive layer 16, when viewed in the plan view of FIG. 31, that is, in an end portion D of the element region 11 covered by the conductive film 16, when viewed in the sectional view of FIG. 32. In particular, in the corners C1 and C2 of the element region 11, this electric field concentration is noticeably caused.

The reason why electric field concentration noticeably occurs in the corners C1 and C2 of the element region 11 is that, at the corners C1 and C2 of the element region 11, the edges of the element region 11 are tapered when seen both in the plan view and in the sectional view, and these corners C1 and C2 are covered by the conductive film 16. This point will be described later in more detail in connection with the manufacturing method of the semiconductor device.

Further, if the electric field concentrates in the capacitor insulation film (silicon oxide film 15) of the MOS capacitor, at the corners C1 and C2 of the elements region 11, then breakdown becomes apt to occur in the capacitor insulation film, at the corners C1 and lowering the reliability and the manufacturing yield of semiconductor devices.

The method of manufacturing the MOS capacitor shown in FIG. 31 and FIG. 32 will be described below.

First, as shown in FIG. 33, a buffer silicon oxide film 21 is formed by thermal oxidation on the silicon substrate 10. Further, by the LPCVD method, a silicon nitride film 22 which functions as a mask material when CMP (chemical mechanical polishing) is performed is formed on the buffer silicon oxide film 21.

Next, as shown in FIG. 34, on the silicon nitride film 22, a resist pattern for defining the element isolation region and the element region 11 from each other is formed by a photolithography step, and, by performing anisotropic etch (such as RIE) using this resist pattern as a mask, the silicon nitride film 22, the buffer silicon oxide film 21 and the silicon substrate 10 are successively etched. As a result, in the substrate 10, there is formed a trench 23 which constitutes the element isolation region. After this, the resist pattern is removed.

Next, as shown in FIG. 35 and FIG. 36, a silicon oxide film is formed by the LPCVD method over the surface of the silicon substrate 10 so as to sufficiently fill up the trench 23. After this, by CMP, this silicon oxide film is polished under the condition that the silicon nitride film 22 is made to serve as a stopper. As a result, the silicon oxide film is left only in the trench 23, and thus, the element isolating insulation film 12 of STI structure is formed.

Next, as shown in FIG. 37 and FIG. 38, the silicon nitride film 22 which is a mask material is removed by hot phosphoric acid treatment. Further, by dilute hydrofluoric acid treatment, the buffer silicon oxide film 21 is removed.

Here, when the buffer silicon oxide film 21 is removed, the surface portion of the element isolating insulation film 12 comprised of a silicon oxide film is also etched. The element isolating insulation film 12, which is sufficiently thick as compared with the buffer silicon oxide film 21, is not all removed, however, particularly, the corner portions of the element region 11 are noticeably etched when seen in a plan view, or the element isolating insulation film 12 is noticeably etched in the end portion D of the element region 11 when seen in a sectional view, and thus, these portions are exposed.

The cause for the occurrence of such a phenomenon is considered to lie in the film quality (density) of the element isolating insulation film 12. That is, when the silicon oxide film is buried into the trench 23, the density of the silicon oxide film in the corner portions of the element region 11 become lower than that of the other portion in some cases, depending on the depositing condition of the CVD. In general, the etching rate of a silicon oxide film is larger in the low density portion than in the high density portion thereof, so that, particularly, the silicon oxide film in the corners of the element region 11 is noticeably etched, and thus, the corners of the element region 11 become apt to be exposed.

Next, as shown in FIG. 39 and FIG. 40, the silicon oxide film 15 is formed by thermal oxidation on the silicon substrate 10 in the element region 11.

Further, as shown in FIG. 41 and FIG. 42, a conductive film (such as a polycrystalline silicon film) 16 is formed by the LPCVD method on the element isolating insulation film 12 and on the silicon oxide film 15. A resist pattern is formed by photolithography, and, using this resist pattern as a mask, the conductive film 16 is patterned by anisotropic etching. After this, the resist pattern is removed off.

Here, the conductive film 16 covers the corners of the element region 11 through the silicon oxide film 15. Due to this, in case a voltage is applied between the silicon substrate 10 and the conductive film 16, the electric field concentrates in the portions of the silicon oxide film 15 which lie on the corners of the element region 11; and thus, breakdown is apt to be caused.

Next, as shown in FIG. 43, by the ion implantation method, an impurity having the same conductivity type as that of the silicon substrate 10 is implanted into the silicon substrate 10 to form a diffusion layer 13. In case the conductive film 16 is comprised of a polycrystalline silicon film, the impurity is introduced into the polycrystalline film by this ion implantation.

After this, by the LPCVD method, an interlayer insulation film (such as a silicon oxide film) 17 is formed over the surface of the silicon substrate 10, covering the conductive layer 16. Further, after a contact hole 19 reaching the diffusion layer 13 is formed in the interlayer insulation film 17, a wiring 14 is formed extending on the interlayer insulation film 17 and in the contact hole 19.

By the steps mentioned above, the MOS capacitor shown in FIG. 31 and FIG. 32 is completed.

In the case of the MOS capacitor formed by such a manufacturing method as mentioned above, the electric field is apt to concentrate on the silicon oxide film in the corners of the element region 11, due to which there arises the problem that breakdown takes place, and thus, the reliability and manufacturing yield of semiconductor devices are lowered.

FIG. 44 shows another example of the conventional MOS capacitor shape.

This shape of MOS capacitor is similar to the shape of the MOS capacitor explained in connection with foregoing Example 1. That is, on a silicon substrate 10, an element isolating insulation film (element isolation region) 12 is formed, and, on the element region 11 surrounded by the element isolating insulation film 12, a conductive film 16 is formed. The conductive film 16 covers three sides and two corners of the element region 11.

FIG. 45 shows an example of the shape of a conventional MOSFET.

On a silicon substrate 10, an element isolating insulation film (element isolation region) 12 is formed, and, on the element region 11 surrounded by the element isolating insulation film 12, a conductive film (gate electrode) 16 is formed through a gate insulation film. The element region 11 has a square shape, and the conductive film 16 extends in the direction perpendicular to two mutually opposed sides of the element region 11 in a state striding over the element region 11. Wirings 14a and 14b are connected to a source/drain diffusion layer via contact holes 19a and 19b, and a wiring 18 is connected to the conductive film 16 via a contact hole 20.

FIG. 46 shows another example of the conventional MOSFET shape.

In this example, the shape of the conductive film (gate electrode) 16 largely differs as compared with that in the example shown in FIG. 45. That is, in this example, the conductive film 16 is formed so as to cover a corner of the element region 11, whereby the transistor is reduced in size and miniaturized, and thus, the shape of the integrated circuit as a whole is reduced.

The MOS capacitor shown in FIG. 44 and the MOSFET shown in FIG. 46 are both alike laid out in such a manner as to cover corners of the element region 11. Such a shape results in making breakdown apt to be caused due to the electric field concentration in the insulation film (the capacitor insulation film or the gate insulation film) portions lying on the corners of the element region 11, so that the initial defect rate of semiconductor devices is increased, the useful life thereof is shortened, and in addition, the reliability and the manufacturing yield thereof are deteriorated.

The peculiar problematic points corresponding to the element isolation methods in the cases where shapes as mentioned above are adopted will be successively described.

(i) Element Isolation Method According to the LOCOS Method

First, as shown in FIG. 47, a buffer silicon oxide film 21 is formed on a silicon substrate 10 by thermal oxidation. Further, by the LPCVD method, a silicon nitride film 22 which functions as a mask material at the time of forming the element isolating insulation film is formed on the buffer silicon oxide film 21.

Further, by a photolithography step, a resist pattern 24 for partitioning the element isolation region and the element region 11 is formed on the silicon nitride film 22, and, by the use of this resist pattern 24 as a mask, the silicon nitride film 22 is etched by anisotropic etching (such as RIE).

After this, when the resist pattern 24 is removed, the pattern of the silicon nitride film 22 is formed as shown in FIG. 48.

Next, as shown in FIG. 49, the surface of the portion of the silicon substrate 10 which is not covered by the silicon nitride film 22 used as a mask material is oxidized by thermal oxidation to form an element isolating insulation film (field oxide film) 12. Thereafter, the silicon nitride film 22 is removed, and further, the buffer silicon oxide film 21 is removed by the use of a wet etchant such as $NH_4F$, whereby, as shown in FIG. 50, the silicon substrate 10 is exposed in the element region 11 surrounded by the element isolating insulation film 12.

Next, as shown in FIG. 51, a silicon oxide film 15 is formed on the thus exposed silicon substrate 10 by thermal oxidation.

Further, as shown in FIG. 52, a conductive film (such as a polycrystalline silicon film) 16 is formed by the LPCVD method on the element isolating insulation film 12 and on the silicon oxide film 15. In case the conductive film 16 is comprised of a polycrystalline film, for example phosphorus (P) which is an n-type impurity is introduced into this polycrystalline silicon film.

Next, as shown in FIG. 53, a resist pattern is formed on the conductive film 16 by a photolithography step, and, using this resist pattern as a mask, the conductive film 16 is patterned by anisotropic etching (such as RIE). Thereafter, the resist pattern is removed, and a diffuses layer 13 is formed by the ion implantation method.

The problematic point of the element isolation method according to the LOCOS method lies in that, for example, when the silicon oxide film 15 which constitutes the gate insulation film of a MOSFET is formed, the portions of the silicon oxide film 15 which lie in the end portions (sides and corners) of the element region 11 becomes thinner than the portion of the silicon oxide film 15 which lies in the center portion of the element region 11.

This phenomenon results from the fact that the silicon oxide film (thermal oxide film) 15 is selectively formed on the exposed silicon substrate 10 (element region 11). That is, in the thermal oxidation of the silicon substrate 10, the thermal oxide film is expanded in volume, so that, in the end portions of the element region 11, the stress due to this volume expansion concentrates, retarding the oxidation speed. In particular, in the corners of the element region 11, large stress concentrates, and thus, the silicon oxide film 15 is noticeably thinned.

Further, due to such circumstances, those portions of the silicon oxide film 15 which lie in the corners of the element region 11 are poor in film quality and have a high defect density.

Thus, if the conducive film 16 is formed so as to cover the corners of the element region 11s, then, when a voltage is applied across the silicon substrate 10 and the conductive film 16, the electric field concentrates in the thin portions of the silicon oxide film 15 lying in the corner portions of the element region 11 and, as a result, leakage current is apt to be caused. Further, this leakage current results in increasing the initial defect rate of semiconductor devices and shortening the useful life thereof and, in addition, lowering the reliability and the manufacturing yield thereof.

(ii) Trench Element Isolation Method (STI) I

The trench element isolation method is superior in respect of the high degree of integration of elements and the flattening of the surface on the silicon substrate; and thus, this method is becoming the main stream of the recent element isolation.

First, as shown in FIG. 55, a buffer silicon oxide film 21 is formed on a silicon substrate 10 by thermal oxidation. Further, by the LPCVD method, a silicon nitride film 22 which functions as a mask material at the time of performing CMP is formed on the buffer silicon oxide film 21. By a photolithography step, a resist pattern 24 for partitioning the element isolation region and the element region 11 10 is formed on the silicon nitride film 22, and, using this resist pattern 24 as a mask, the silicon nitride film 22, the buffer silicon oxide film 21 and the silicon substrate 10 are successively etched by RIE.

After this, the resist pattern 24 is removed, whereby, as shown in FIG. 56, a trench 23 which will constitute an element isolation region is formed in the silicon substrate 10.

Next, as shown in FIG. 57, a silicon oxide film 12' which completely fills up the trench 23 is formed on the whole surface of the silicon substrate 10 by the LPCVD method or the plasma CVD method.

After this, the silicon oxide film 12' is polished by CMP under the condition that the silicon nitride film 22 is used as a stopper, whereby, as shown in FIG. 58, the silicon oxide film 12' is left only in the trench 23, and thus an element isolating insulation film 12 of STI structure is formed.

Further, the silicon nitride film 22 which is a mask material is removed by performing a measure such as RIE, CDE (Chemical Dry Etching), hot hydrofluoric acid treatment. Further, using for example HF, NH$_4$F, the buffer silicon oxide film 21 is removed. In this case, the element isolation insulating film 12 is etched to such a degree that the surface thereof becomes approximately equal to the surface of the silicon substrate 10 as shown in FIG. 59.

Next, as shown in FIG. 60, a silicon oxide film 15 is formed by thermal oxidation on the silicon substrate 10 in the element region 11.

Further, as shown in FIG. 61, a conductive film (such as a polycrystalline silicon film) 16 is formed on the element isolating insulation film 12 and on the silicon oxide film 15 by the LPCVD method. By photolithography, a resist pattern is formed, and, using this resist pattern as a mask, the conductive film 16 is patterned by RIE. After this, the resist pattern is peeled off.

The problematic point of the trench element isolation method is that, when the buffer silicon oxide film 21 is removed, the surface of the element isolating insulation film (silicon oxide film) 12 becomes lower than the surface of the silicon substrate 10 in some cases. In this case, particularly if the conductive film 16 is formed so as to cover corners of the element region 11, then, when a voltage is applied across the silicon substrate 10 and the conductive film 16, the electric field concentrates in the portions of the silicon oxide film 15 which lie on the corner portions of the element region 11, and thus, there occurs a state in which breakdown is apt to be caused.

Thus, there arises the problem that the MOS capacitors and MOSFETs formed by such a manufacturing method are low in the reliability and the manufacturing yield.

(iii) Trench Element Isolation Method (STI) II

This trench element isolation method has its feature in the point that, for example, after the gate insulation film of a MOSFET is formed, the element isolating insulation film is formed.

First, as shown in FIG. 62, a silicon oxide film (gate insulation film) 15 is formed on a silicon substrate 10 by thermal oxidation. Further, by the LPCVD method, a conductive film (such as a polycrystalline film) 16A and a silicon oxide film 22 which functions as a mask material at the time of performing CMP are formed on the silicon oxide film 15. By a photolithography step, a resist pattern 24 for partitioning the element isolation region and the element region 11 is formed on the silicon nitride film 22, and, using this resist pattern 24 as a mask, the silicon nitride film 22, the conducive film 16A, the silicon oxide film 15 and the silicon substrate 10 are successively etched by RIE.

After this, the resist pattern 24 is removed, whereby, as shown in FIG. 63, a trench 23 which will constitute the element isolation region is formed in the silicon substrate 10.

Next, as shown in FIG. 64, a silicon oxide film 12' for completely filling up the trench 23 is formed on the whole surface of the silicon substrate 10 by the LPCVD method or the plasma CVD method.

After this, by CMP, the silicon oxide film 12' is polished under the condition that the silicon nitride film 22 is serves as a stopper, whereby, as shown in FIG. 65, the silicon oxide film 12' is left only in the trench 23, and thus, an element isolating insulation film 12 of STI structure is formed.

Next, as shown in FIG. 66, the element isolating insulation film 12 is etched by the use of, for example, HF, NH$_4$F, whereby the surface of the element isolating insulation film 12 is brought close to the surface of the conductive film 16A. By so doing, the difference in height between the element isolating insulation film 12 and the conductive film 16A is reduced, so that, when a conductive film (gate electrode) is processed later, a sufficient processing margin can be secured.

After this, by a measure such as RIE, CDE or hot phosphoric acid treatment, the silicon nitride film 22 which is a mask material is removed, whereby a structure as shown in FIG. 67 can be obtained.

Next, as shown in FIG. 68, the natural oxide film existing on the surface of the conductive film 16A is removed, and then, by the LPCVD method, a conductive film (such as a polycrystalline silicon film) 16B is formed in a state stacked on the conductive film 16A. Further, by photolithography, a resist pattern is formed, so that, using this resist pattern as a mask, the conductive film (gate electrode) 16B is patterned by RIE. After this, the resist pattern is peeled off.

The problematic point of this trench element isolation method lies in that, for example when the surface of the element isolating insulation film 12 is etched by the use of, for example, HF, $NH_4F$, if the element isolating insulation film 12 and the silicon nitride film 22 are not so tightly joined to each other, then the etching proceeds along the interface between the element isolating insulation film 12 and the silicon nitride film 22, as a result of which the silicon oxide film (gate insulation film) 15 comes to be etched.

Particularly, in the corner portions of the element region 11, the shape thereof is apt to become unstable, so that such a phenomenon is apt to take place. Thus, if the conductive films 16A and 16B are formed so as to cover corners of the element region 11, then there arise problems such as the problem that, in case a voltage is applied across the silicon substrate 10 and the conductive films 16A and 16B, breakdown takes place, or the occurrence frequency of initial defects of semiconductor devices is increased, and thus, the useful life of the semiconductor devices is shortened.

BRIEF SUMMARY OF THE INVENTION

The present invention has been made in order to give solutions to the above-mentioned problems, and it is the object of the invention to prevent the occurrence of breakdown and enhance the reliability and manufacturing yield with respect to a semiconductor device such as MOSFET or MOS capacitor which comprises a conducive film formed extending over an element isolation region and an element region and has, in the element region, a capacitor structure comprising a semiconductor substrate, an insulation layer and a conductive film.

In order to achieve the above-mentioned object, according to a first aspect of the present invention, there is provided a semiconductor device comprising an element region having a polygonal shape which has a plurality of sides and a plurality of corners; an element isolation region surrounding the element region; an insulation film formed on the element region; and a conductive film formed on the insulation film, having such a shape as to cover two adjacent sides of the element region and not to cover a corner which is an intersecting point of the two adjacent sides of the element region.

In a semiconductor device according to the first aspect of the present invention, the shape of the element region may be square.

In a semiconductor device according to the first aspect of the present invention, the shape of the element region may be rectangular.

In a semiconductor device according to the first aspect of the present invention, the shape of the element region may be of L-shape.

In a semiconductor device according to the first aspect of the present invention, the shape of the element region may be convex.

In a semiconductor device according to the first aspect of the present invention, the element isolation region may have a LOCOS structure.

In a semiconductor device according to the first aspect of the present invention, the element isolation region may have an STI structure.

In a semiconductor device according to the first aspect of the present invention, the conductive film may be an electrode of a MOS capacitor.

In a semiconductor device according to the first aspect of the present invention, the conductive film may be a gate electrode of a MOSFET.

According to a second aspect of the present invention, there is provided a semiconductor device comprising an element region having a ring shape which has a plurality of sides and a plurality of corners; an element isolation region surrounding the element region; an insulation film formed on the element region; and a conductive film formed on the insulation film, having such a shape as to cover two adjacent sides inside the ring shape and not to cover a corner which is an intersecting point of the two sides inside the ring shape, wherein the element region has a ring shape which has a plurality of sides and a plurality of corners, the conductive film has such a shape as to cover two adjacent sides and not to cover the corner which is the intersecting point of the two adjacent sides inside the ring shape.

In a semiconductor device according to the second aspect of the present invention, the shape of the element region may be square-like ring.

In a semiconductor device according to the second aspect of the present invention, the shape of the element region may be rectangle-like ring.

In a semiconductor device according to the second aspect of the present invention, the element isolation region may have a LOCOS structure.

In a semiconductor device according to the second aspect of the present invention, the element isolation region may have an STI structure.

In a semiconductor device according to the second aspect of the present invention, the conductive film may be an electrode of a MOS capacitor.

In a semiconductor device according to the second aspect of the present invention, the conductive film may be a gate electrode of a MOSFET.

According to a third aspect of the present invention, there is provided a semiconductor integrated circuit comprising a semiconductor substrate and a plurality of semiconductor elements formed on the semiconductor substrate, each of the semiconductor elements including an element region having a polygonal shape which has a plurality of sides and a plurality of corners; an element isolation region surrounding the element region; an insulation film formed on the element region; and a conductive film formed on the insulation film, having such a shape as to cover two adjacent sides of the element region and not to cover a corner which is an intersecting point of the two adjacent sides of the element region.

In a semiconductor device according to the third aspect of the present invention, the shape of the element region may be square.

In a semiconductor device according to the third aspect of the present invention, the shape of the element region may be rectangular.

In a semiconductor device according to the third aspect of the present invention, the shape of the element region may be of L-shape.

In a semiconductor device according to the third aspect of the present invention, the shape of the element region may be convex.

In a semiconductor device according to the third aspects of the present invention, the element isolation region may have a LOCOS structure.

In a semiconductor device according to the third aspect of the present invention, the element isolation region may have an STI structure.

In a semiconductor device according to the third aspect of the present invention, the conductive film may be an electrode of a MOS capacitor.

In a semiconductor device according to the third aspect of the present invention, the conductive film may be a gate electrode of a MOSFET.

In a semiconductor device according to the third aspect of the present invention, the element regions may be arranged in a matrix form.

According to a fourth aspect of the present invention, there is provided a semiconductor integrated circuit comprising a semiconductor substrate and a plurality of semiconductor elements formed on the semiconductor substrate, each of the semiconductor elements including an element region having a ring shape which has a plurality of sides and a plurality of corners; an element isolation region surrounding the element region; an insulation film formed on the element region; and a conductive film formed on the insulation film, having such a shape as to cover two adjacent sides inside the ring shape and not to cover a corner which is an intersecting point of the two sides inside the ring shape.

In a semiconductor device according to the fourth aspect of the present invention, the shape of the element region may be square-like ring.

In a semiconductor device according to the fourth aspect of the present invention, the shape of the element region may be rectangle-like ring.

In a semiconductor device according to the fourth aspect of the present invention, the element isolation region may have a LOCOS structure.

In a semiconductor device according to the fourth aspect of the present invention, the element isolation region may have an STI structure.

In a semiconductor device according to the fourth aspect of the present invention, the conductive film may be an electrode of a MOS capacitor.

In a semiconductor device according to the fourth aspect of the present invention, the conductive film may be a gate electrode of a MOSFET.

In a semiconductor device according to the fourth aspect of the present invention, the element regions may be arranged in a matrix form.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
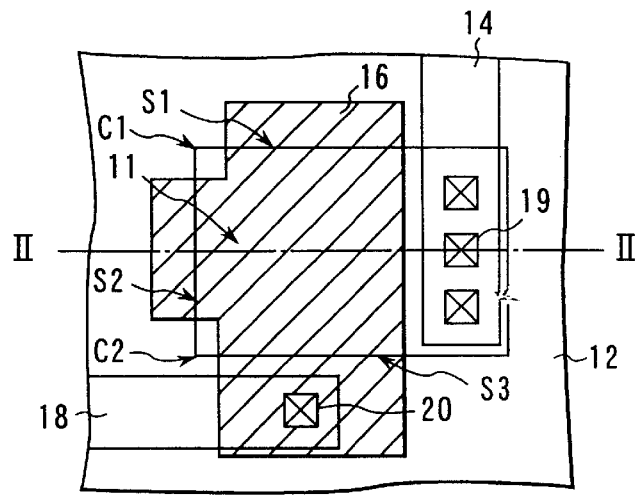
FIG. 1 is a diagram showing the shape of the MOS capacitor according to a first embodiment of the present invention.

The semiconductor device according to the present invention will now be described in detail, referring to the drawings.

Figure 2:
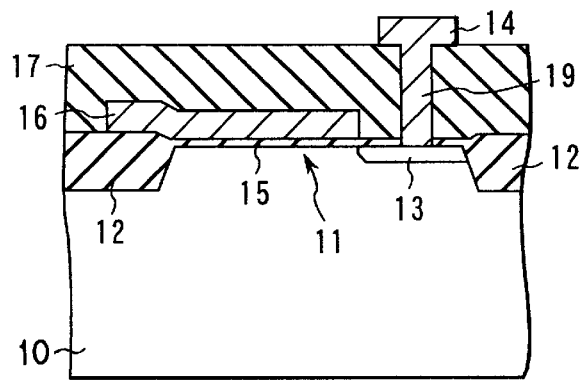
FIG. 2 is a sectional view taken along the line II—II in FIG. 1.

FIG. 1 shows the shape of the MOS capacitor according to a first embodiment of the present invention. FIG. 2 is a sectional view taken along the line II—II in FIG. 1.

On a silicon substrate 10, an element isolating insulation film 12 of STI structure is formed. The element isolating insulation film 12 constitutes an element isolation region, surrounding an element region 11. The element region 11 has a shape such as a square shape which has a plurality of sides and a plurality of corners. The element region 11 may have a rectangular shape.

Within the silicon substrate 10 in the element region 11, there is formed a diffusion layer 13 which has the same conductivity type as that of the silicon substrate 10 and has an impurity atom concentration higher than that of the silicon substrate 10. Connected to the diffusion layer 13 is a wiring 14 provided for setting the potential of the silicon substrate 10.

In this embodiment, with respect to the element region 11 shown, the diffusion layer 13 and the wiring 14 are provided, but, in case a diffusion layer and a wiring layer for setting the potential of the substrate are provided in another region (including the element region 11) which is not shown, the diffusion layer 13 and the wiring 14 may not be provided with respect to the element region 11 shown.

On the silicon substrate 10 in the element region 11, a silicon oxide film 15 is formed. Further, on the element isolating insulation film 12 and on the silicon oxide film 15, a conductive film 16 is formed. The conductive film 16 is composed of a metal, a semiconductor containing an impurity, or the like. The conductive film 16 is formed striding over the element isolating insulation region and the element region 11, and thus, in the element region 11, there is formed a capacitor structure consisting of the silicon substrate 10, the silicon oxide film 15 and the conductive film 16.

Here, the conductive film 16 has such a shape as to cover three sides S1, S2 and S3 and not to cover the corners of the element region 11. Particularly, the corners C1 and C2 of the element region 11 which lie at the side at which the diffusion layer 13 is not formed are covered by the conductive film 16 in case of the conventional technique but not covered by the conductive film 16 in case of the present invention.

On the conductive film 16, an interlayer insulation film (such as a TEOS film or an EPSG film) 17 is formed. On the interlayer insulation film 17, wirings 14 and 18 are formed. The wiring 14 is connected to the diffusion layer 13 via a contact hole 19, while the wiring 18 is connected to the conductive film 16 via a contact hole 20.

In the MOS capacitor which has the above-mentioned structure, the conductive film 16 has such a shape as to cover none of the corners of the element region 11. Therefore, even if the portions of the silicon oxide film which lie on the corner portions of the element region 11 become thin or the film quality thereof is deteriorated, no breakdown due to the concentration of electric field is caused. Thus, according to the shape of the present invention, the reliability and the manufacturing yield of MOS capacitors can be enhanced.

The method of manufacturing the MOS capacitor shown in FIG. 1 and FIG. 2 will be described below.

Figure 3:
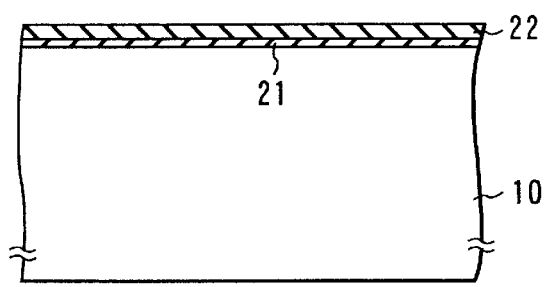
FIG. 3 is a diagram showing a section of the semiconductor structure at one step of the method for the manufacture of the MOS capacitor shown in FIG. 1.

First, as shown in FIG. 3, a buffer silicon oxide film 21 is formed on the silicon substrate 10 by thermal oxidation. Further, by the LPCVD method, a silicon nitride film 22 which functions as a mask material when CMP is carried out is formed on the buffer silicon oxide film 21. As the mask material, a stacked type film consisting of a silicon oxide film and a silicon nitride film can be used as well as the silicon nitride film.

Figure 4:
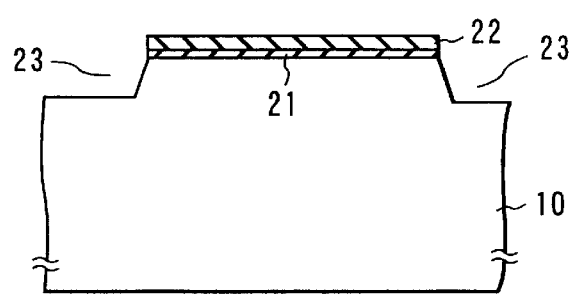
FIG. 4 is a diagram showing a section of the semiconductor structure at one step of the method for the manufacture of the MOS capacitor shown in FIG. 1.

Next, a shown in FIG. 4, a resist pattern for partitioning the element isolation region and the element region 11 is formed on the silicon nitride film 22 by a photolithography step, and, using this resist pattern as a mask, the silicon nitride film 22, the buffer silicon oxide film 21 and the silicon substrate 10 are successively etched by anisotropic etching (such as RIE). As a result, a trench which will constitute the element region 11 is formed in the silicon substrate 10. After this, the resist pattern is removed.

Figure 5:
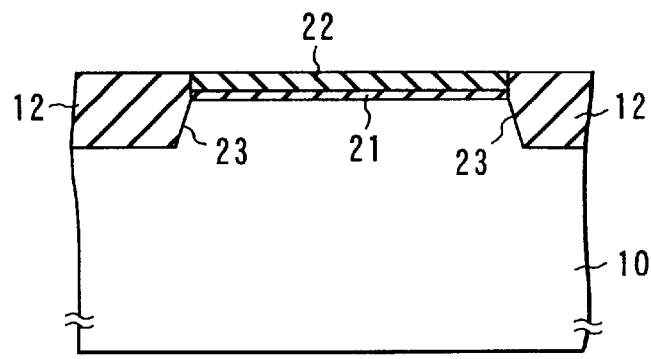
FIG. 5 is a diagram showing a section of the semiconductor structure at one step of the method for the manufacture of the MOS capacitor shown in FIG. 1.

Next, as shown in FIG. 5, a silicon oxide film for completely filling up the trench 23 is formed over the whole surface of the silicon substrate 10 by the LPCVD method or the plasma CVD method. After this, this silicon nitride film 22 is polished by CMP under the condition that the silicon nitride film 22 serves as a stopper. As a result, the silicon oxide film is left only in the trench 23, and thus, the element isolation insulating film 12 of STI structure is formed.

After this, the silicon nitride film 22 which is a mask material is removed by the use of a measure such as RIE, CDE or hot phosphoric acid treatment. Further, the buffer silicon oxide film 21 is removed by wet etching using for example HF or $NH_4F$ or by dry etching such as RIE.

Figure 6:
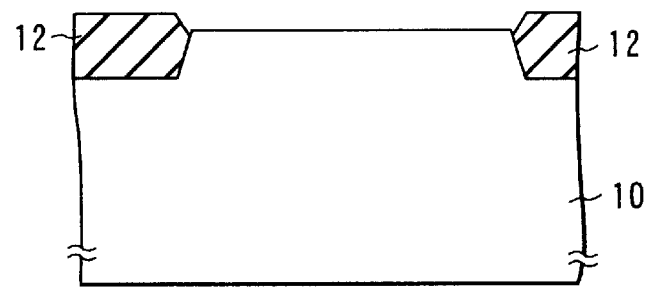
FIG. 6 is a diagram showing a section of the semiconductor structure at one step of the method for the manufacture of the MOS capacitor shown in FIG. 1.

Here, when the buffer silicon oxide film 21 is removed, the surface portion of the element isolating insulation film 12 comprised of a silicon oxide film is also etched as shown in FIG. 6. The element isolating insulation film 12 is sufficiently thick as compared with the buffer silicon oxide film, all of the element isolating insulation film 12 is not etched, but the portions of the element isolating insulation film 12 which lie on the corner portions of the element region 11 is noticeably etched, so that the silicon substrate 10 is exposed in the corner portions of the element region 11.

Figure 7:
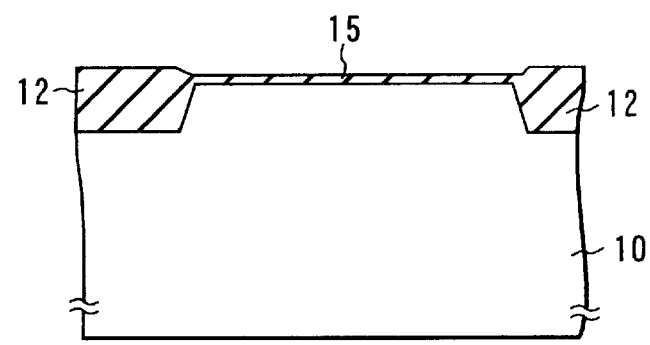
FIG. 7 is a diagram showing a section of the semiconductor structure at one step of the method for the manufacture of the MOS capacitor shown in FIG. 1.

Next, as shown in FIG. 7, a silicon oxide film 15 is formed on the silicon substrate 10 in the element region 11 by thermal oxidation.

Figure 8:
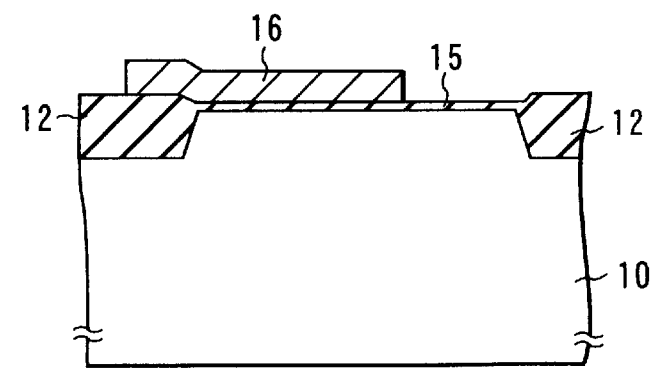
FIG. 8 is a diagram showing a section of the semiconductor structure at one step of the method for the manufacture of the MOS capacitor shown in FIG. 1.

Next, as shown in FIG. 8, a conductive film (such as a polycrystalline film) 16 is formed on the element isolating insulation film 12 and on the silicon oxide film 15 by the LPCVD method. By photolithography, a resist pattern is formed, and, using this resist pattern as a mask, the conductive film 16 is patterned by anisotropic etching. After this, the resist pattern is peeled off.

Here, the conductive film 16 is etched to have such a shape as to avoid all the corners of the element regional. Due to this, even if a voltage is applied across the silicon substrate 10 and the conductive film 16, the electric field does not concentrate on the silicon oxide film 15 in the corner portions of the element region 11, and thus, no breakdown is caused, either.

After this, as shown in FIG. 1 and FIG. 2, an impurity of the same conductivity type as that of the silicon substrate 10 is implanted into the silicon substrate 10 by the ion implanting method, whereby a diffusion layer 13 is formed. Further, by the LPCVD method, an interlayer insulation film 17 is formed over the whole surface of the silicon substrate 10, covering the conductive film 16. Moreover, a contact hole 19 reaching the diffuse layer 13 is formed in the interlayer insulation film 17, and then, a wiring 14 is formed lying on the interlayer insulation film 17 and in the contact hole 19.

With the steps mentioned above, the MOS capacitor shown in FIG. 1 and FIG. 2 are completed.

In the MOS capacitor formed by the manufacturing method as mentioned above, any of the corners of the element region 11 is not covered by the conductive layer 16, so that no breakdown is caused, and thus, an enhancement in the reliability and manufacturing yield of semiconductor devices can be achieved.

Figure 9:
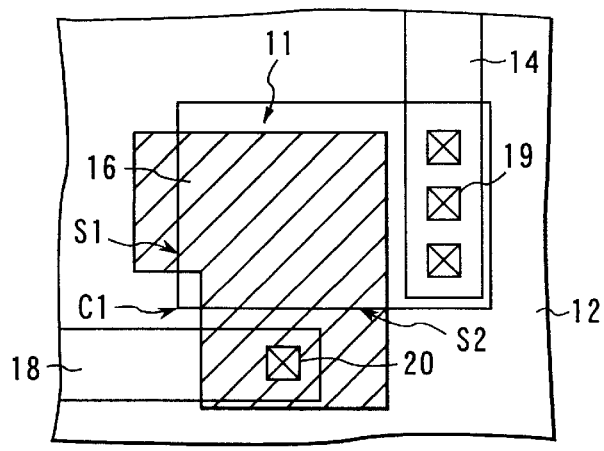
FIG. 9 is a diagram showing the shape of the MOS capacitor according to a second embodiment of the present invention.
Figure 10:
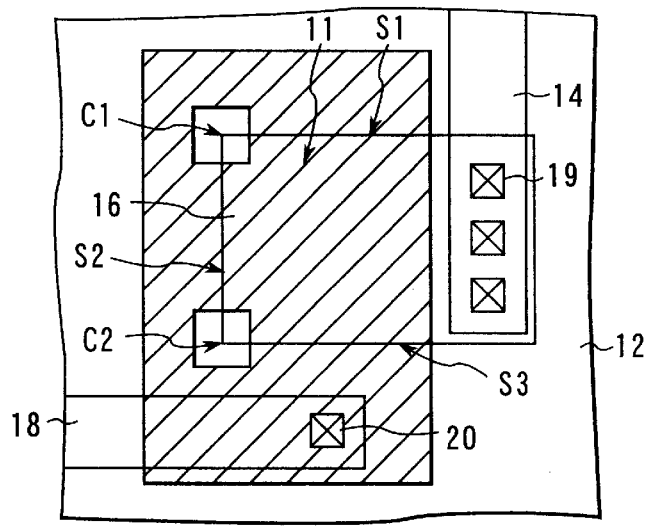
FIG. 10 is a diagram showing the shape of the MOS capacitor according to a third embodiment of the present invention.
Figure 11:
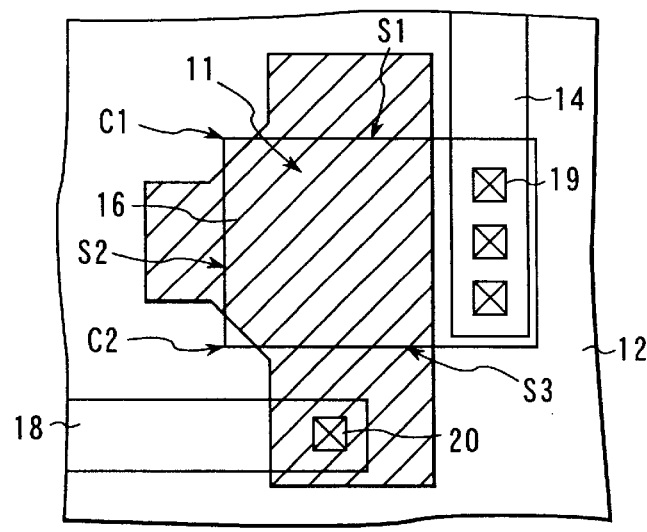
FIG. 11 is a diagram showing the shape of the MOS capacitor according to a fourth embodiment of the present invention.

FIGS. 9 to 10 show the shapes of the MOS capacitors according to second to fourth embodiments of the present invention.

The capacitors according to these embodiments which each have a feature in that the pattern of the conductive film 16 differs from that of the above-mentioned MOS capacitor according to the first embodiment.

In the embodiment shown in FIG. 9, the conductive film 16 has such a shape as to cover two mutually adjacent sides S1 and S2 of the element region 11 and not to cover corner C1 of the element region 11 which corner is the intersecting point of the two sides S1 and S2. That is, the conductive film 16 is formed so as not to cover the corners of the element region 11.

In the embodiment shown in FIG. 10, the conductive film 16 has such a shape as to cover three sides S1, S2 and S3 and has openings on the corner C1 of the element region 11 which corner is the intersecting point of the sides S1 and S2 and on the corner C2 of the element region 11 which corner is the intersecting point of the sides S2 and S3. In this embodiment, the conductive film 16 is also formed so as not to cover the corners of the element region 11.

In the embodiment shown in FIG. 10, the conductive film 16 has such a shape as to cover the three sides S1, S2 and S3 and not to cover the corner C1 of the element region 11 which corner is the intersecting point of the sides S1 and S2 and the corner C2 of the element region 11 which corner is the intersecting point of the sides S2 and S3. In case of this embodiment, in the corner portions C1 and C2 of the element region 11, triangles are formed by the edge line of the conductive film 16 and the sides S1, S2 and S3 of the element region 11.

In the MOS capacitor of the above-mentioned structure, the conductive film 16 has likewise such a shape as not to cover any of the corners of the element region 11. Thus, even if the portions of the silicon oxide film which lie on the corner portions of the element region 11 become thin or the film quality thereof is deteriorated, no breakdown due to electric field concentration is caused; and thus, the reliability and the manufacturing yield of semiconductor devices can be enhanced.

FIGS. 12 to 15 show the shapes of the MOS capacitors according to fifth to eighth embodiments of the present invention.

The MOS capacitors according to these embodiments differ from the above-mentioned MOS capacitor according to the first embodiment in that the patterns of the respective conductive films 16 of the former differ from the pattern of the latter, and further, the former have a feature in that no contact portion exists with respect to the silicon substrate.

Figure 12:
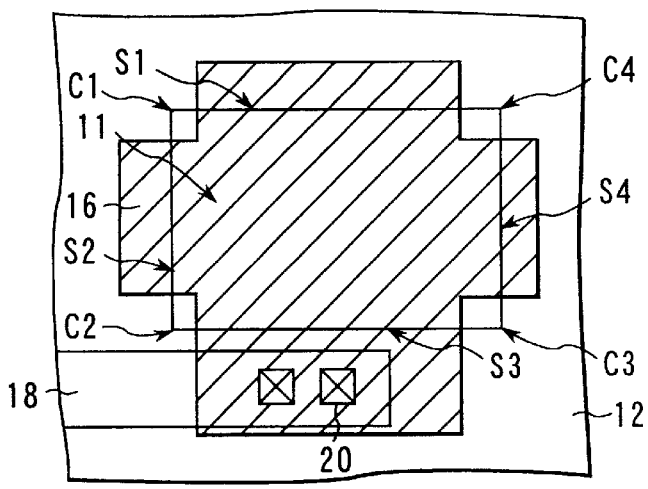
FIG. 12 is a diagram showing the shape of the MOS capacitor according to a fifth embodiment of the present invention.

In the embodiment shown in FIG. 12, the conductive film 16 has such a shape as to cover four sides S1 to S4 of the element region 11 and not to cover any of four corners C1 to C4. That is, the conductive film 16 is formed so as not to cover the corners of the element region 11.

Figure 13:
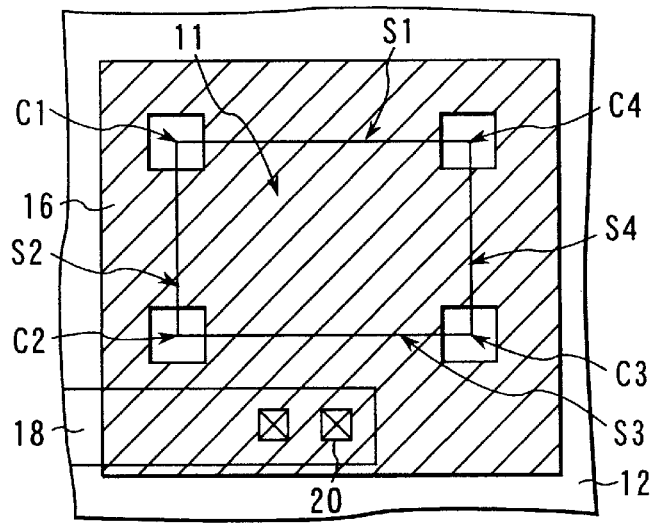
FIG. 13 is a diagram showing the shape of the MOS capacitor according to a sixth embodiment of the present invention.

In the embodiment shown in FIG. 13, the conductive film 16 has such a shape as to cover the four sides S1 to S4 of the element region 11 and has openings on the four corners C1 to C4. The respective openings each have a square shape. In this embodiment, the conductive film 16 is likewise formed so as not to cover the corners of the element region 11.

Figure 14:
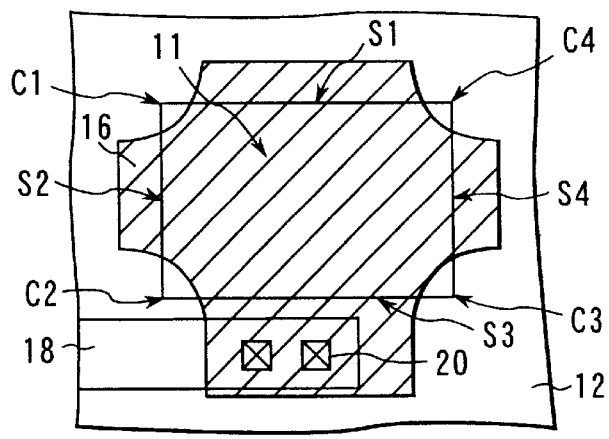
FIG. 14 is a diagram showing the shape of the MOS capacitor according to a seventh embodiment of the present invention.

In the embodiment shown in FIG. 14, the conductive film 16 has such a shape as to cover the four sides S1 to S4 of the element region 11 and not to cover the four corners C1 to C4. The edge line portions of the conductive film 16 which are close to the four corners C1 to C4 of the element region 11 are made circular or curved.

Figure 15:
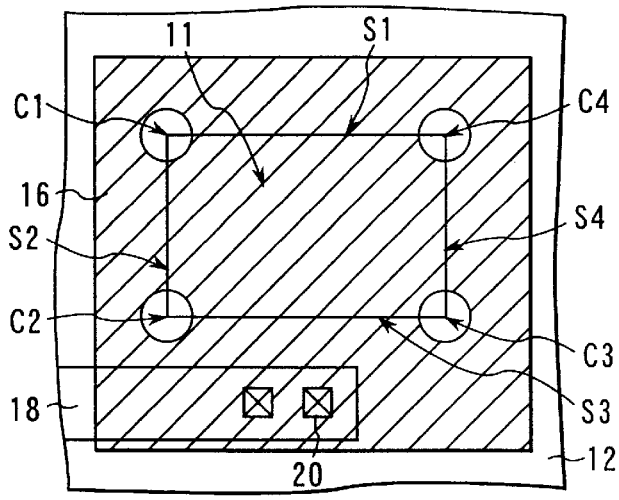
FIG. 15 is a diagram showing the shape of the MOS capacitor according to a eighth embodiment of the present invention.

In the embodiment shown in FIG. 15, the conductive film 16 has such a shape as to cover the four sides S1 to S4 of the element region 11 and has openings on the four corners C1 to C4. In this embodiment, the openings of the conductive film 16 are round in shape.

In the MOS capacitors having the above-mentioned structures, no contact portion is provided with respect to the silicon substrate, so that the capacitor area of the MOS capacitor can be increased to such a degree as to become equal to the size of the element region 11. The contact portion with respect to the silicon substrate is provided in a region other than the element region 11 shown.

Further, since the conductive film 16 has such a shape as not to cover any of the corners of the element region 11, no breakdown takes place in the capacitor insulation film, and thus, the reliability and manufacturing yield of MOS capacitors can be enhanced.

Figure 16:
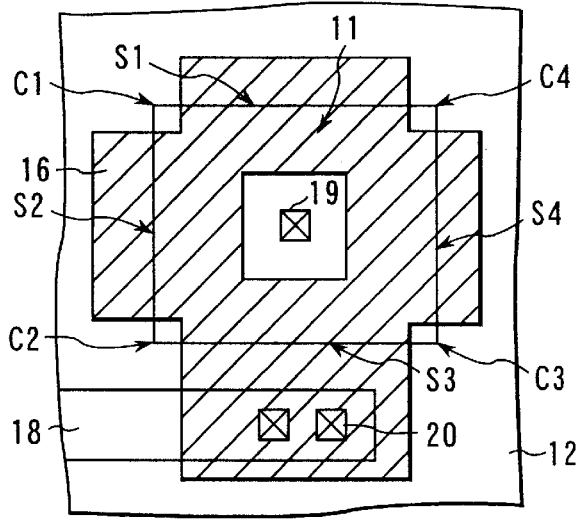
FIG. 16 is a diagram showing the shape of the MOS capacitor according to a ninth embodiment of the present invention.

FIG. 16 shows the shape of the MOS capacitor according to a ninth embodiment of the present invention.

In the capacitor according to this embodiment, the conductive film 16 has such a shape as to cover the four sides S1 to S4 of the element region 11 and not to cover the corners of the element region 11. Further, in the center portion of the element region 11, an opening is provided in the conductive film 16, and, in this opening, a contact portion 19 is formed with respect to the silicon substrate.

According to such a structure, the potential of the silicon substrate in the element region 11 can be stabilized. Further, since the conductive film 16 has such a shape as not to cover any of the corners of the element region 11, the reliability and manufacturing yield of MOS capacitors can be enhanced.

Figure 17:
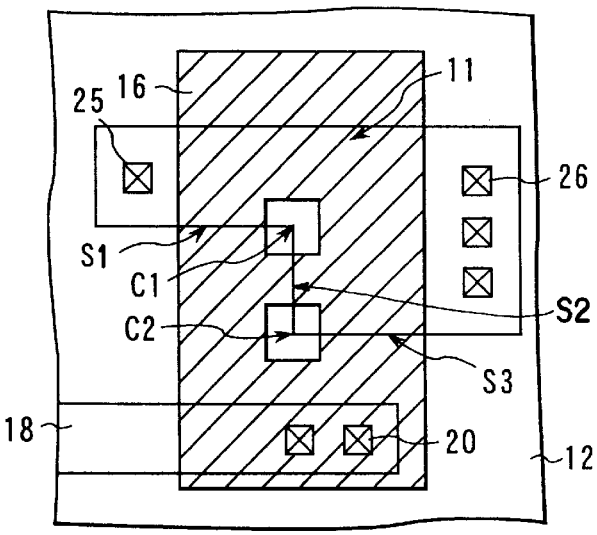
FIG. 17 is a diagram showing the shape of the semiconductor device according to a tenth embodiment of the present invention.

FIG. 17 shows the shape of the MOS capacitor according to a tenth embodiment of the present invention.

The first to ninth embodiments are based on the premise that the element region 11 is square in shape, but the element region 11 may be any shape other than square. That is, this tenth embodiment relates to the shape of the conductive film 16 in which the element region 11 is not square.

In this embodiment, the element region 11 has an L-shape, but the conductive film 16 has such a shape as not to cover the corners of the element region 11. Further, at both end sides of the conductive film 16, contact portions 25 and 26 are provided with respect to the silicon substrate. The shape of this embodiment can also be applied to a MOSFET. In this case, for example, the conductive film 16 is used as the gate electrode, the contact portion 25 is used as a contact portion with respect to the source (or the drain), and the contact portion 26 is used as a contact portion with respect to the drain (or the source).

Further, as for the corner C1 of the element region 11, the element region 11 side angle thereof is made obtuse. Thus, in this corner portion, no noticeable electric field concentration is caused. However, in the corner C1 of the element region 11, the density of the element isolating insulation film 12 is low, so that, when the buffer silicon oxide film is etched the element isolating insulation film 12 is also etched to expose the silicon substrate in some cases.

Therefore, the fact that the corner portion C1 of the element region 11 is not covered by the conductive film 16 is also effective in enhancing the reliability and the manufacturing yield.

Figure 18:
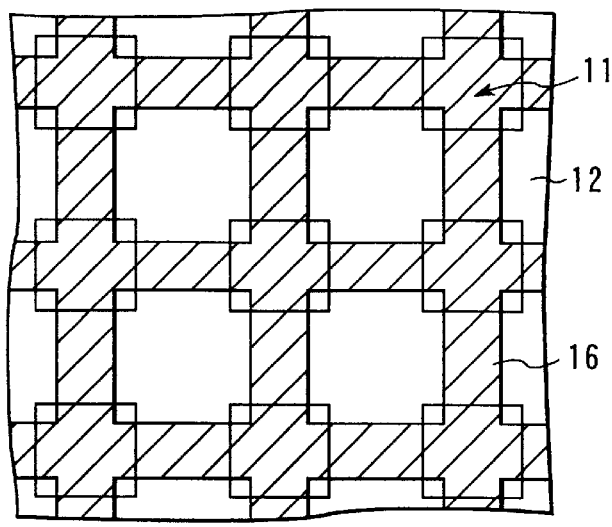
FIG. 18 is a diagram showing the shape of the semiconductor device according to an eleventh embodiment of the present invention.

FIG. 18 shows the shape of the semiconductor device according to an eleventh embodiment of the present invention.

On a silicon substrate 10, a lattice-shaped element isolating insulation film (element isolation region) 12 is formed. The square regions surrounded by the element isolating insulation film 12 constitute element region 11s, which are formed in a matrix-like arrangement. On the silicon substrate 10 and on the element isolating insulation film 12, a lattice-shaped conductive film 16 is formed. The conductive film 16 is used as an electrode of a MOS capacitor, the gate electrode of a MOSFET or a wiring.

The regions surrounded by the conductive film 16, that is, the opening portions of the conductive film 16 are formed so as to include all the corners of the element region 11. Therefore, none of the corners of the element region 11 is covered by the conductive film 16.

Such a shape of the conductive film 16 can be realized by ordinary photolithography or dry etching such as RIE.

As the size or pitch of the element region 11s becomes smaller, pattern deformation and etch residue are caused when the conductive film 16 is patterned, but by laying out the conductive film 16 so as not to cover the corners of the element region 11s, the occurrence of short circuiting between the silicon substrate 10 and the conductive film 16 in the corner portions of the element region 11 can be prevented.

Figure 19:
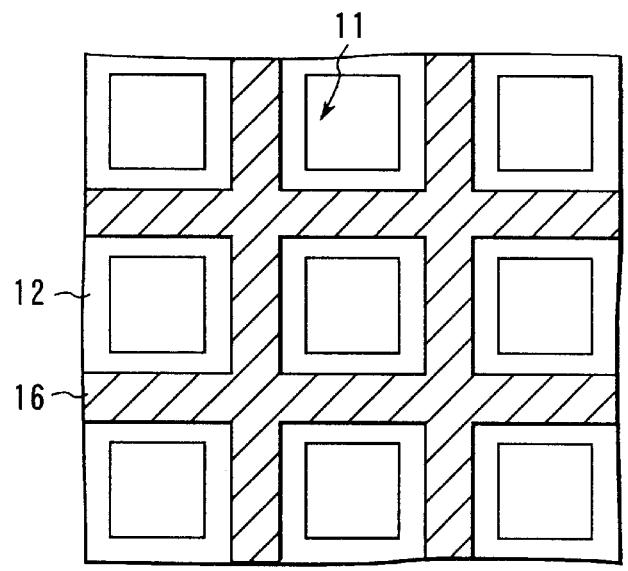
FIG. 19 is a diagram showing the shape of the semiconductor device according to a twelfth embodiment of the present invention.

FIG. 19 shows the shape of the semiconductor device according to a twelfth embodiment of the present invention.

On a silicon substrate 10, a lattice-shaped element isolating insulation film (element isolation region) 12 is formed. The square regions surrounded by the element isolating insulation film 12 constitute element region 11s, which are formed in a matrix-like shape. On the element isolating insulation film 12, there is formed a lattice-shaped conductive film 16 which has a shape similar to that of the element isolating insulation film 12. The conductive film 16 is used as a wiring (including a dummy wiring).

The regions surrounded by the conductive film 16, that is, the opening portions of the conductive film 16 are each a size larger than the respective element region 11 and formed in a state wrapping therein the whole of the respective element region 11. Thus, any of the corners of the element region 11s is not covered by the conductive film 16.

By laying out the conductive film 16 so as not to cover the corners of the element region 11s, the occurrence of short circuiting between the silicon substrate 10 and the conductive film 16 in the corner portions of the element region 11s can be prevented.

Figure 20:
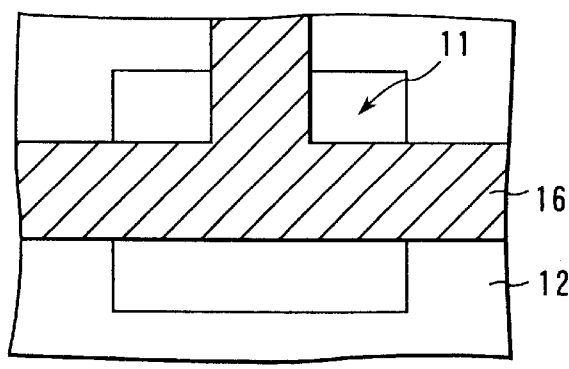
FIG. 20 is a diagram showing the shape of the semiconductor device according to a thirteenth embodiment of the present invention.
Figure 21:
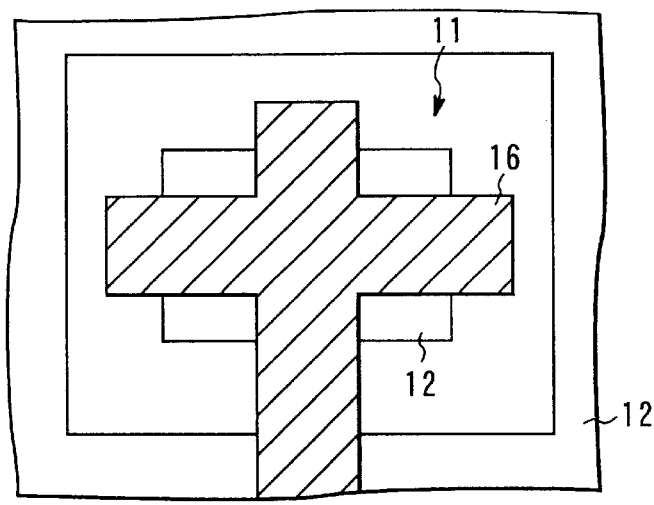
FIG. 21 is a diagram showing the shape of the semiconductor device according to a fourteenth embodiment of the present invention.
Figure 22:
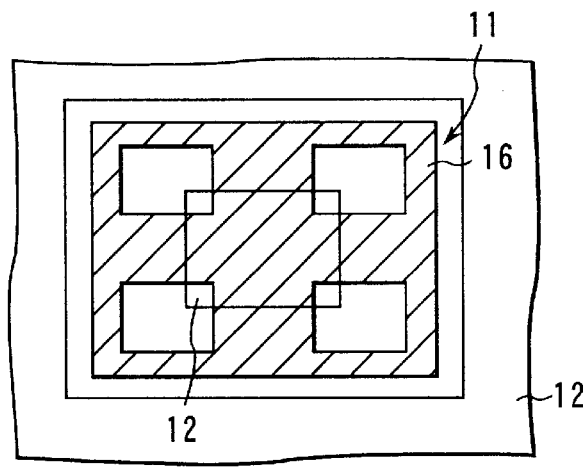
FIG. 22 is a diagram showing the shape of the semiconductor device according to a fifteenth embodiment of the present invention.

FIGS. 20 to 22 show the shapes of the semiconductor devices according to thirteenth to fifteenth embodiments of the present invention.

On a silicon substrate 10, an element isolating insulation film (element isolation region) 12 is formed. The region surrounded by the element isolating insulation film 12 constitutes an element region 11. On the silicon substrate 10 and on the element isolating insulation film 12, a conductive film 16 is formed. The conductive film 16 is used as an electrode of a MOS capacitor, the gate electrode of a MOSFET or the like.

In any of the embodiments mentioned above, any of the corners of the element region 11 are not covered by the conductive film 16. By laying out the conductive film 16 so as not to cover the corners of the element region 11 as mentioned above, the occurrence of breakdown in the corner portions of the element region 11 can be prevented, whereby the reliability and the manufacturing yield can be enhanced.

FIGS. 23 to 28 show the shapes of the MOS capacitors according to sixteenth to twenty-first embodiments of the present invention.

Figure 23:
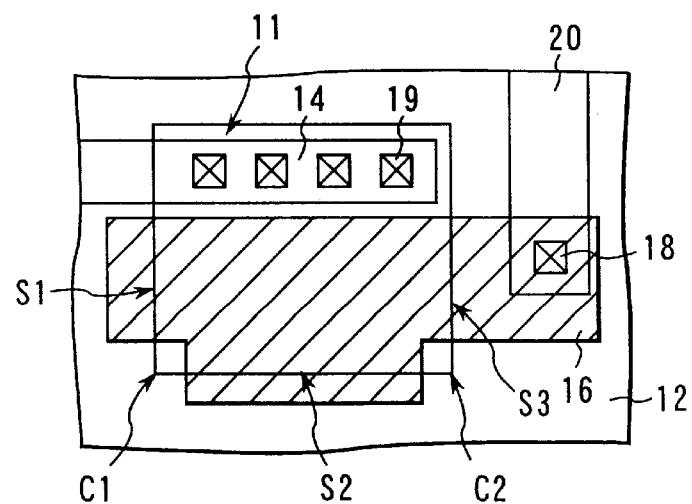
FIG. 23 is a diagram showing the shape of the MOS capacitor according to a sixteenth embodiment of the present invention.

In the embodiment shown in FIG. 23, a conductive film 16 has such a shape as to cover three sides S1, S2 and S3 of an element region 11 and not to cover a corner of the element region 11 which corner is the intersecting point of the sides S1 and S2 and a corner C2 of the element region 11 which corner is the intersecting point of the sides S2 and S3. Further, numeral 18 denotes a contact portion with respect to the conductive film 16, and numeral 19 denotes a contact portion with respect to the silicon substrate 10.

Figure 24:
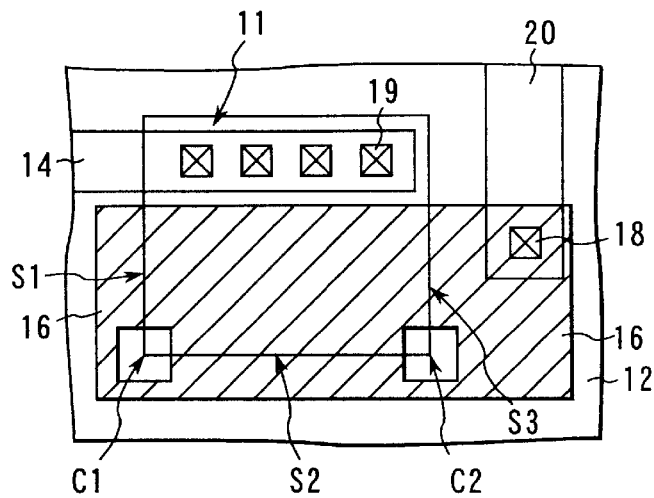
FIG. 24 is a diagram showing the shape of the MOS capacitor according to a seventeenth embodiment of the present invention.

In the embodiment shown in FIG. 24, a conductive film 16 has such a shape as to cover three sides S1, S2 and S3 and have openings on a corner C1 of the element region 11 which corner is the intersecting point of the sides S1 and S2 and on a corner C2 of the element region 11 which corner is the intersecting point of the sides S2 and S3. That is, the conductive film 16 is formed so as not to cover the corners of the element region 11.

Figure 25:
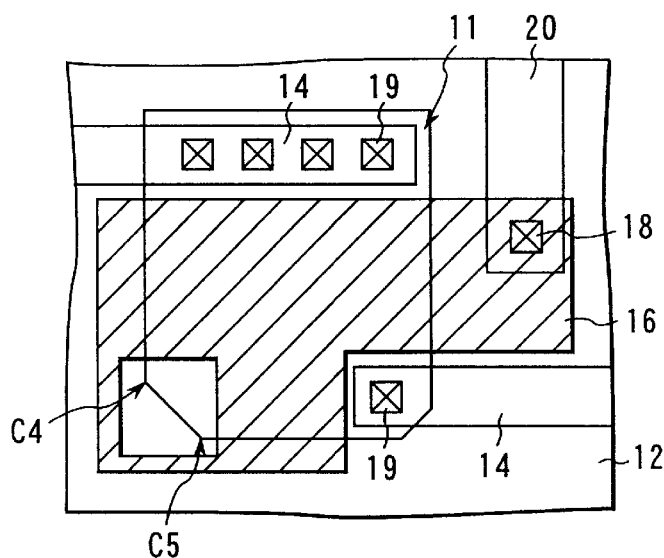
FIG. 25 is a diagram showing the shape of the MOS capacitor according to an eighteenth embodiment of the present invention.

In the embodiment shown in FIG. 25, a corner of an element region 11 is cut off in order to prevent the occurrence of breakdown in the corner portion of the element region 11. Further, by cutting off the corner, obtuse portions C4 and C5 are formed, but, on these portions C4 and C5, an opening is formed to thereby enhance the reliability and the manufacturing yield.

Figure 26:
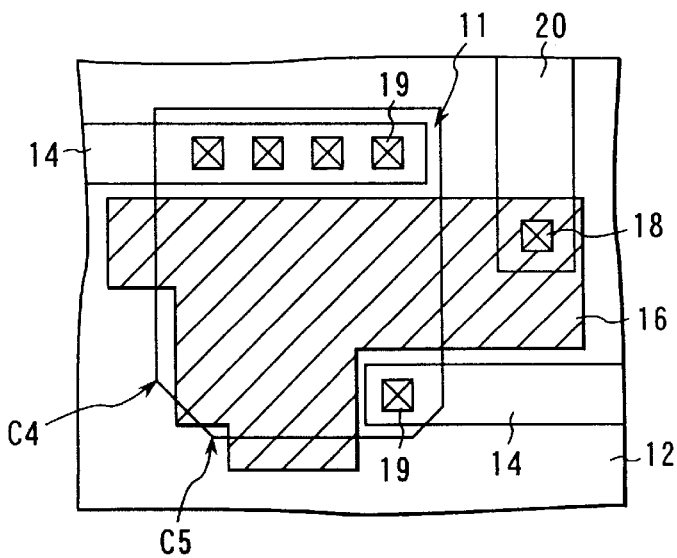
FIG. 26 is a diagram showing the shape of the MOS capacitor according to a nineteenth embodiment of the present invention.

The embodiment shown in FIG. 26 is a modification of the embodiment shown in FIG. 25. In this embodiment, no opening is provided on the obtuse portions C4 and C5, but contrivance is made on the pattern of the conductive film 16 so that the obtuse portions C4 and C5 are not covered by the conductive film 16. By so doing, the reliability and the manufacturing yield of MOS capacitors are enhanced.

Figure 27:
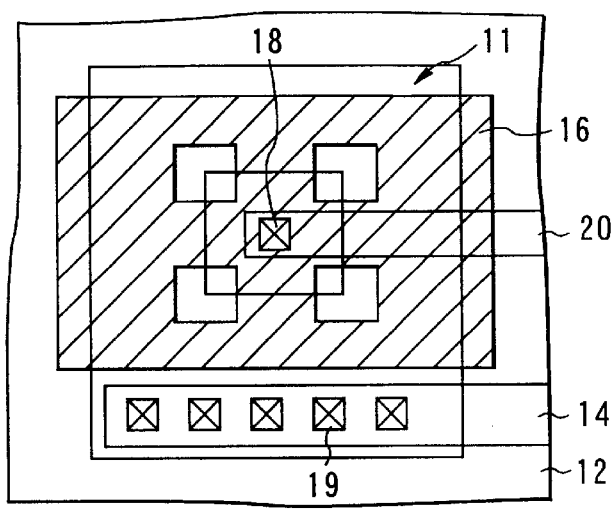
FIG. 27 is a diagram showing the shape of the MOS capacitor according to a twentieth embodiment of the present invention.

The embodiment shown in FIG. 27 relates to a device in which an element region 11 is square-like ring, shaped. The element region 11 is rectangle-like ring-shaped. A conductive film 16 has such a shape as not to cover the corners of the ring-shaped element region 11. As for the inside corners of the ring-shaped element region 11, openings are provided on the inside corners, so that the conductive film 16 is not positioned on the inside corners. The conductive film 16 covers adjacent inside sides of the element region 11. On the portion of an element isolating insulation film 12 which exists in the center of the ring-shaped element region 11, a contact portion 18 is provided with respect to the conductive film 16.

Figure 28:
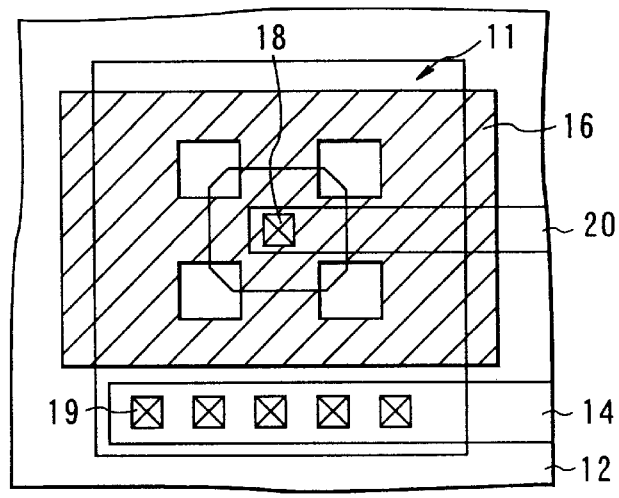
FIG. 28 is a diagram showing the shape of the MOS capacitor according to a twenty-first embodiment of the present invention.

The embodiment shown in FIG. 28 is a modification of the embodiment shown in FIG. 27. In this embodiment, in order to prevent the occurrence of breakdown in the inside corner portions of the ring-shaped element region 11, the inside corners of the element region 11s are cut off. Further, by cutting off the corners, obtuse portions are formed, but, on these obtuse portions, openings are formed to enhance the reliability and the manufacturing yield.

Figure 29:
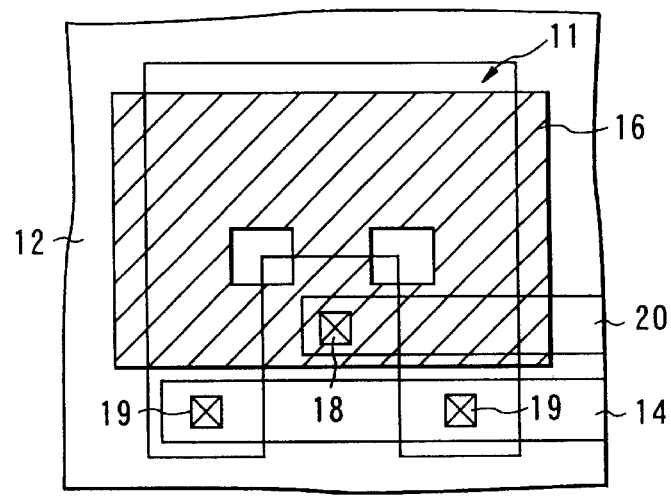
FIG. 29 is a diagram showing the shape of the MOS capacitor according to a twenty-second embodiment of the present invention.
Figure 30:
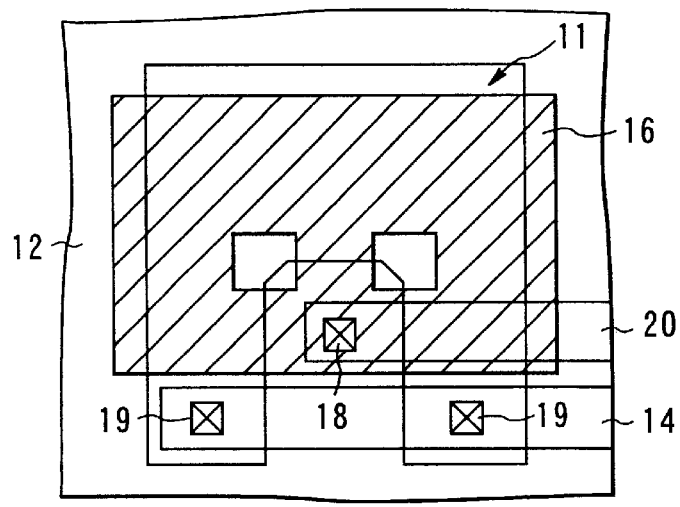
FIG. 30 is a diagram showing the shape of the MOS capacitor according to a twenty-third embodiment of the present invention.
Figure 31:
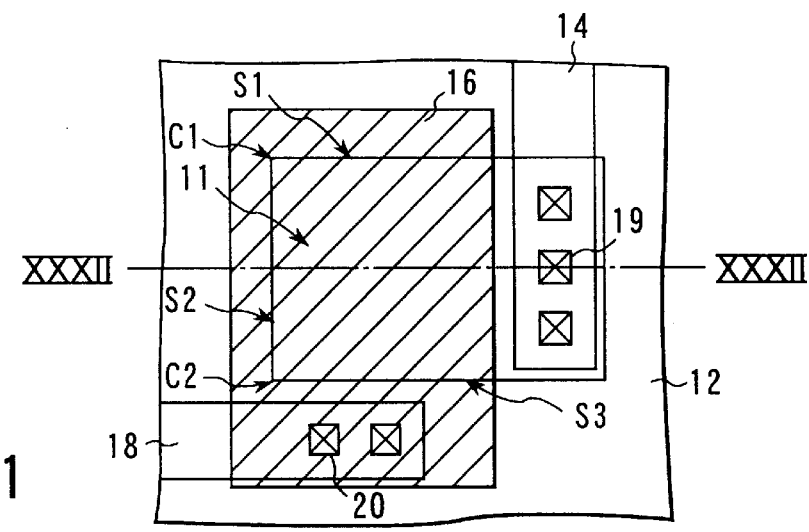
FIG. 31 is a diagram showing the shape of a conventional MOS capacitor.
Figure 32:
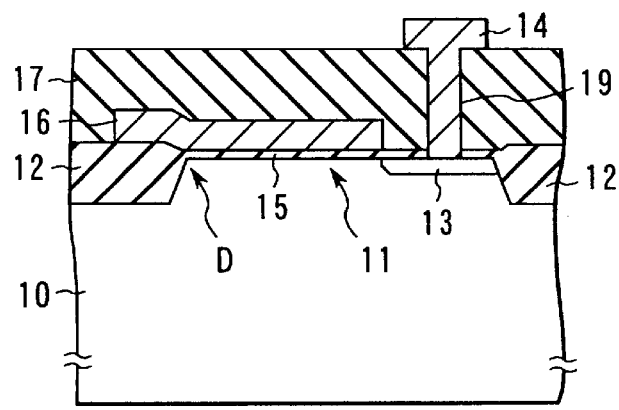
FIG. 32 is a sectional view taken along the line XXXII—XXXII in FIG. 31.
Figure 33:
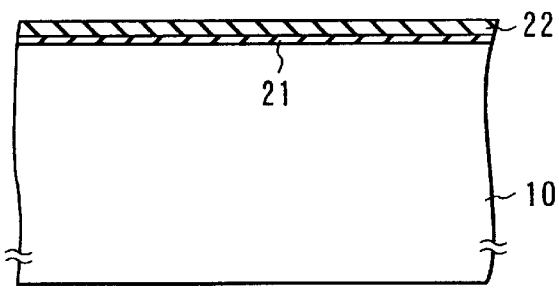
FIG. 33 is a diagram showing a section of the semiconductor structure at one step of the method for the manufacture of the MOS capacitor shown in FIG. 31.
Figure 34:
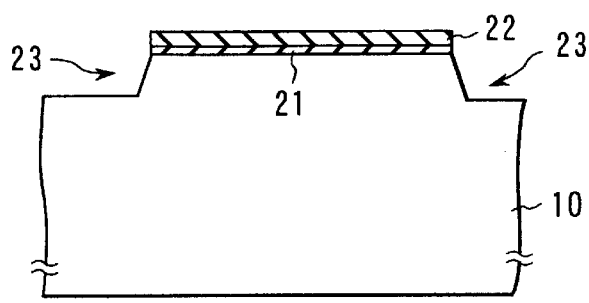
FIG. 34 is a diagram showing a section of the semiconductor structure at one step of the method for the manufacture of the MOS capacitor shown in FIG. 31.
Figure 35:
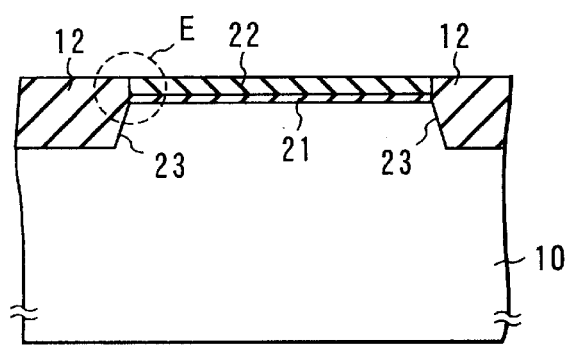
FIG. 35 is a diagram showing a section of the semiconductor structure at one step of the method for the manufacture of the MOS capacitor shown in FIG. 31.
Figure 36:
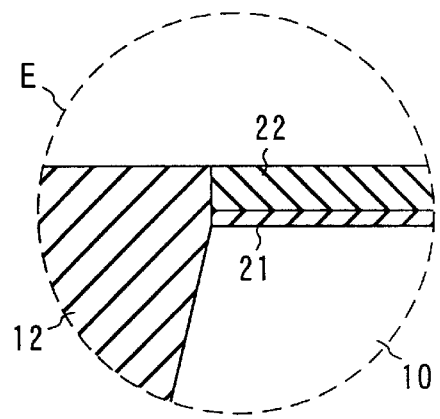
FIG. 36 is an enlarged view of the region E shown in FIG. 35.
Figure 37:
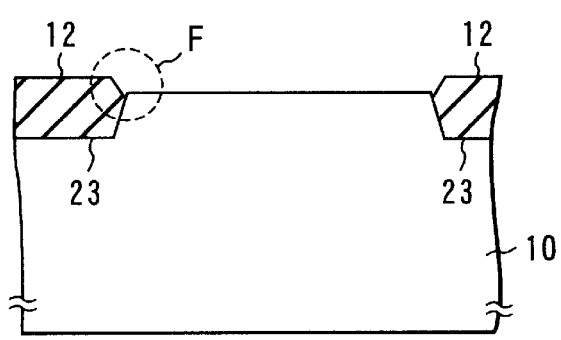
FIG. 37 is a diagram showing a section of the semiconductor structure at one step of the method for the manufacture of the MOS capacitor shown in FIG. 31.
Figure 38:
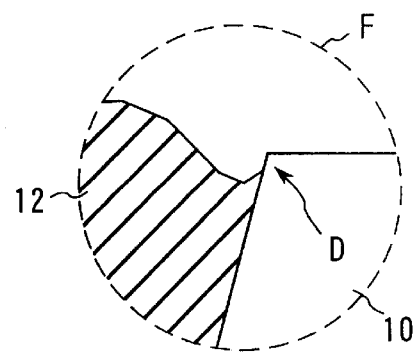
FIG. 38 is an enlarged view of the region F shown in FIG. 37.
Figure 39:
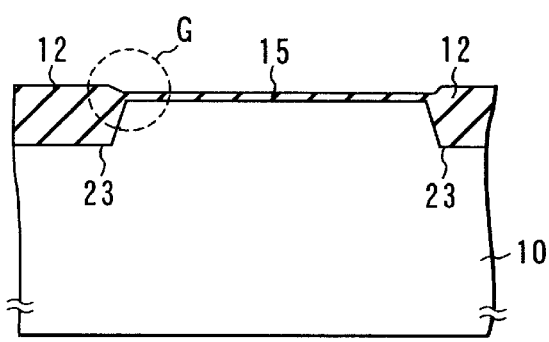
FIG. 39 is a diagram showing a section of the semiconductor structure at one step of the method for the manufacture of the MOS capacitor shown in FIG. 31.
Figure 40:
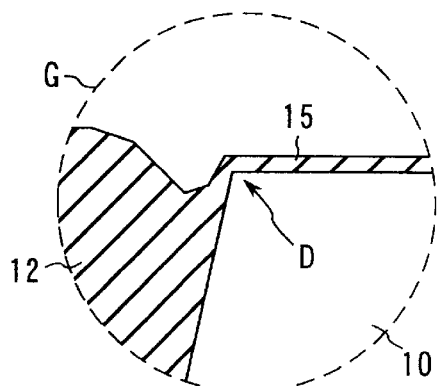
FIG. 40 is an enlarged view of the region G shown in FIG. 39.
Figure 41:
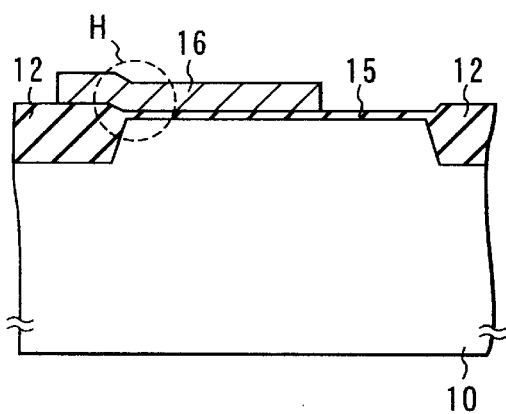
FIG. 41 is a diagram showing a section of the semiconductor structure at one step of the method for the manufacture of the MOS capacitor shown in FIG. 31.
Figure 42:
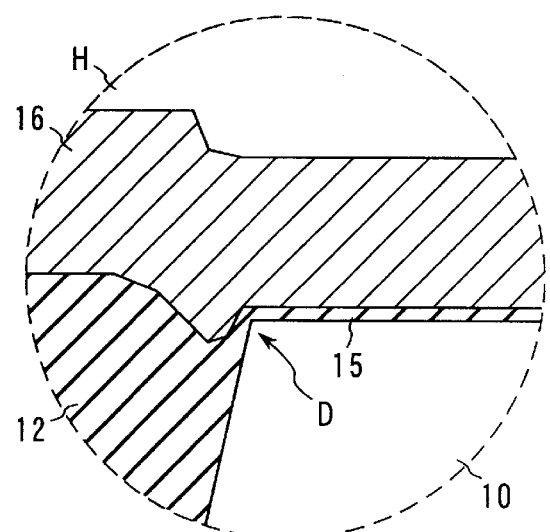
FIG. 42 is an enlarged view of the region H shown in FIG. 41.
Figure 43:
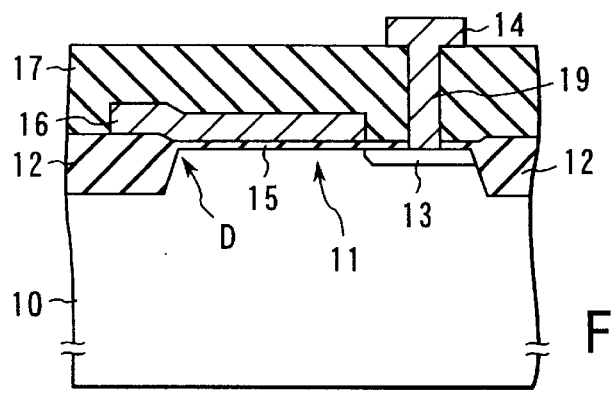
FIG. 43 is a diagram showing a section of the semiconductor structure at one step of the method for the manufacture of the MOS capacitor of FIG. 31.
Figure 44:
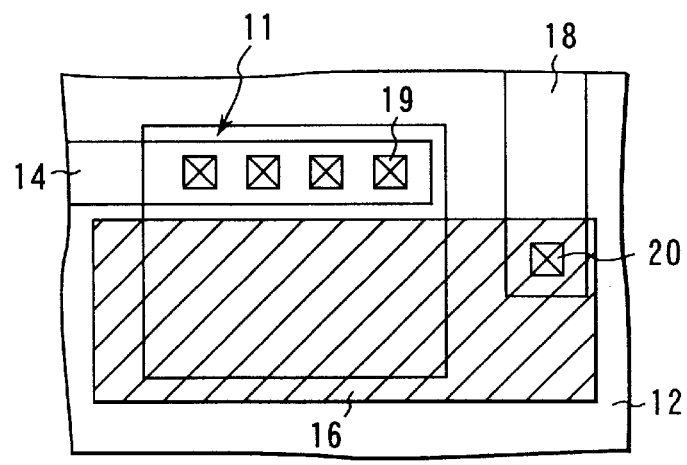
FIG. 44 is a diagram showing the shape of a conventional MOS capacitor.
Figure 45:
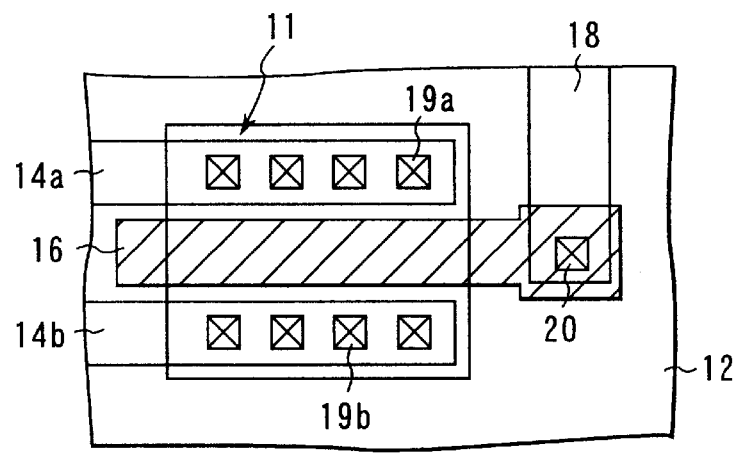
FIG. 45 is a diagram showing the shape of a conventional MOSFET.
Figure 46:
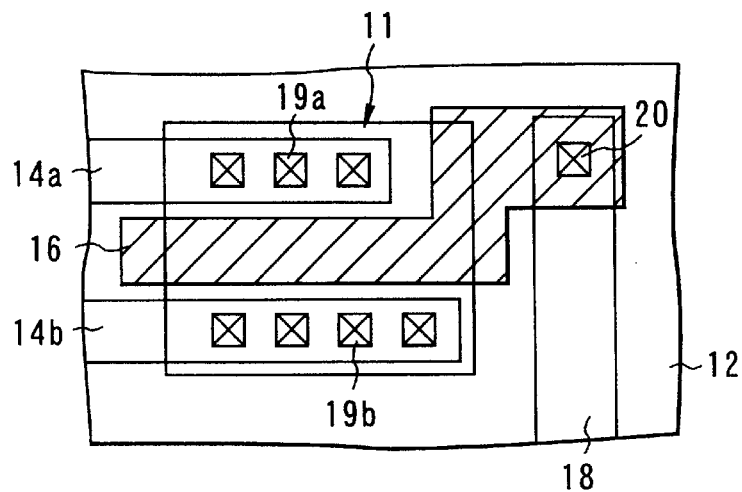
FIG. 46 is a diagram showing the shape of a conventional MOSFET.
Figure 47:
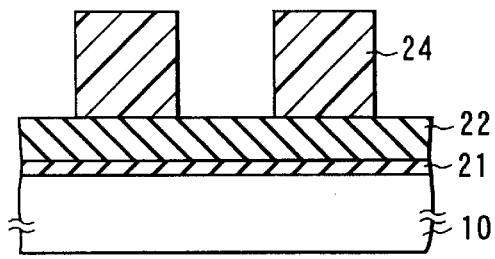
FIG. 47 is a diagram showing a section of the semiconductor structure at one step of the method for the manufacture of the semiconductor devices shown in FIGS. 44 to 46.
Figure 48:
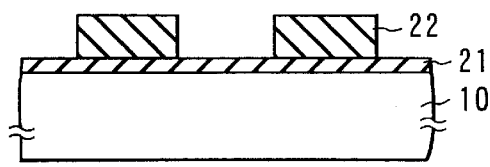
FIG. 48 is a diagram showing a section of the semiconductor structure at one step of the method for the manufacture of the semiconductor devices shown in FIGS. 44 to 46.
Figure 49:
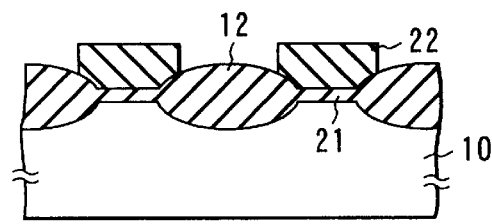
FIG. 49 is a diagram showing a section of the semiconductor structure at one step of the method for the manufacture of the semiconductor devices shown in FIGS. 44 to 46.
Figure 50:
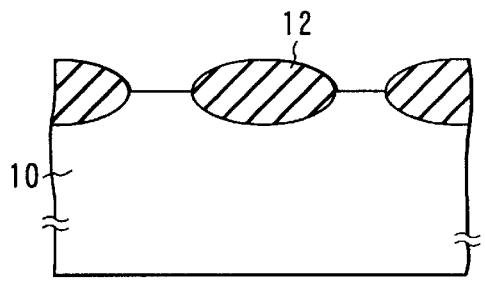
FIG. 50 is a diagram showing a section of the semiconductor structure at one step of the method for the manufacture of the semiconductor devices shown in FIGS. 44 to 46.
Figure 51:
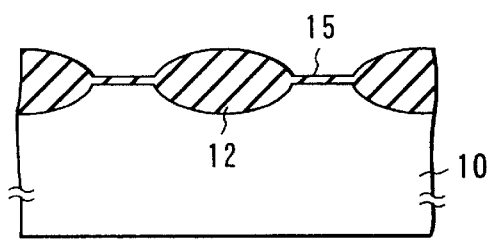
FIG. 51 is a diagram showing a section of the semiconductor structure at one step of the method for the manufacture of the semiconductor devices shown in FIGS. 44 to 46.
Figure 52:
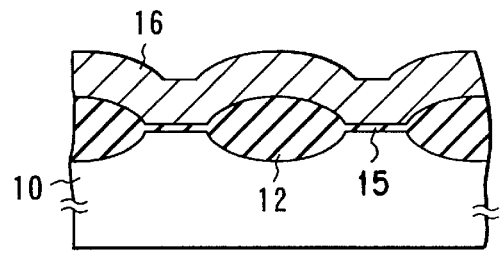
FIG. 52 is a diagram showing a section of the semiconductor structure at one step of the method for the manufacture of the semiconductor devices shown in FIGS. 44 to 46.
Figure 53:
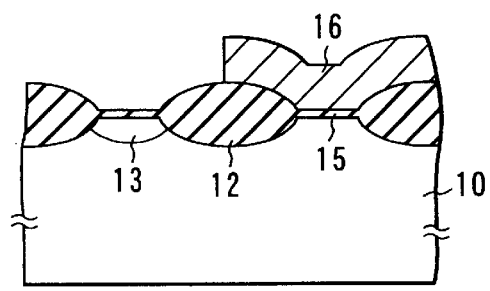
FIG. 53 is a diagram showing a section of the semiconductor structure at one step of the method for the manufacture of the semiconductor devices shown in FIGS. 44 to 46.
Figure 54:
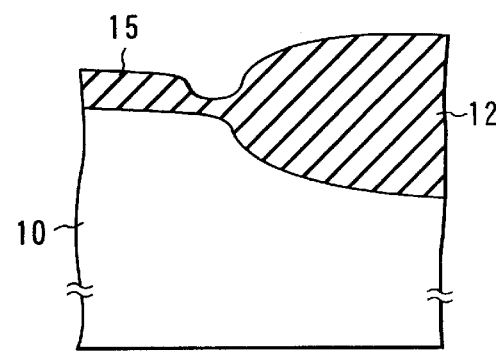
FIG. 54 is an enlarged sectional view of a portion of the semiconductor structure obtained by the above-mentioned method for the manufacture of the semiconductor devices shown in FIGS. 44 to 46.
Figure 55:
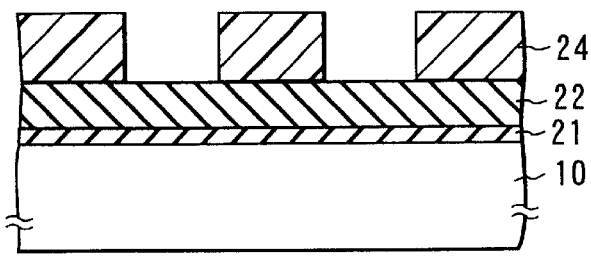
FIGS. 55 to 61 are diagrams each showing a section of the semiconductor structure at the respective steps of another method for the manufacture of the semiconductor devices shown in FIGS. 44 to 46.
Figure 56:
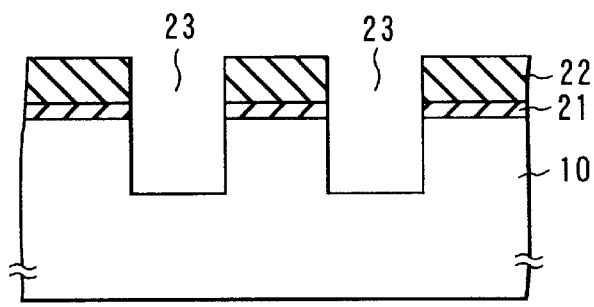
Figure 57:
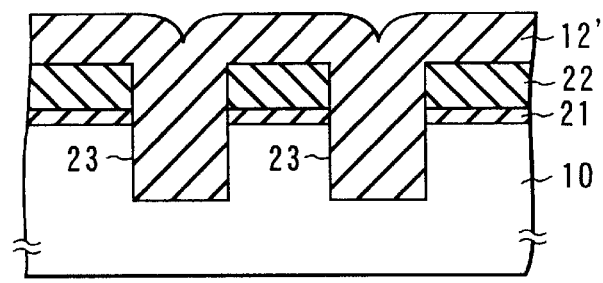
Figure 58:
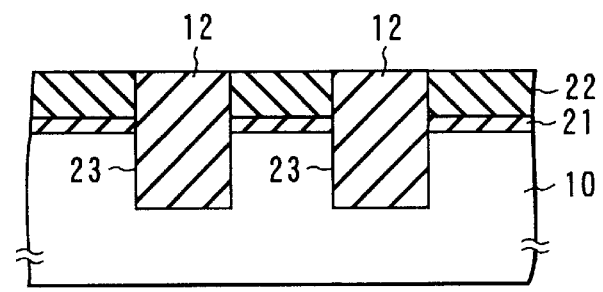
Figure 59:
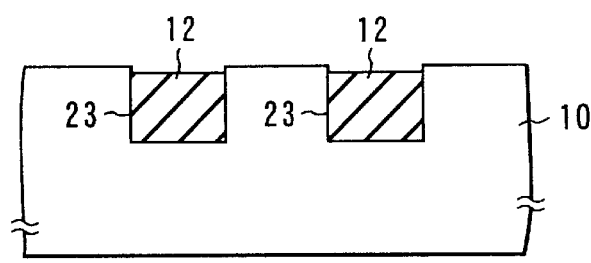
Figure 60:
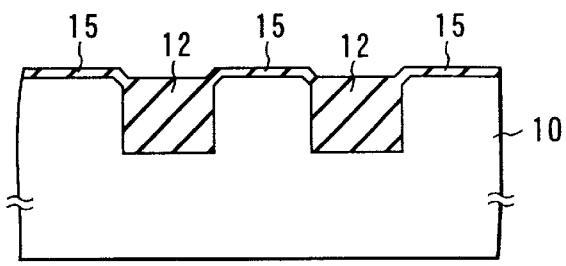
Figure 61:
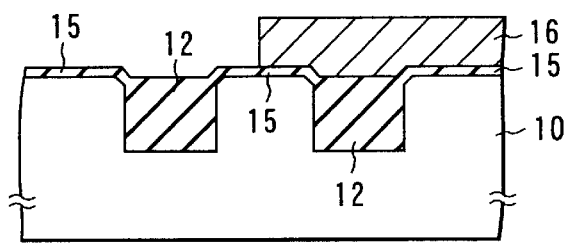
Figure 62:
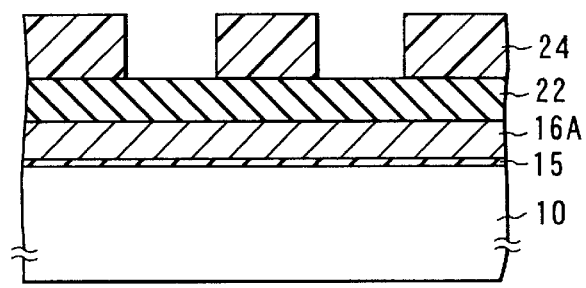
FIGS. 62 to 68 are diagrams each showing a section of the semiconductor structure at the respective steps of still another method for the manufacture of the semiconductor devices shown in FIGS. 44 to 46.
Figure 63:
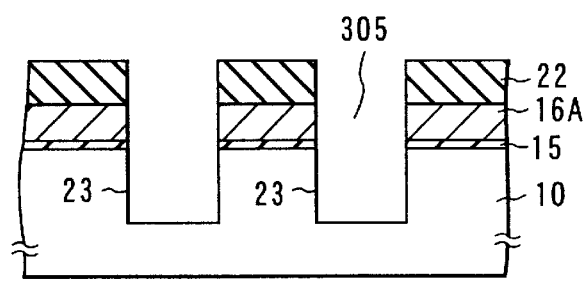
Figure 64:
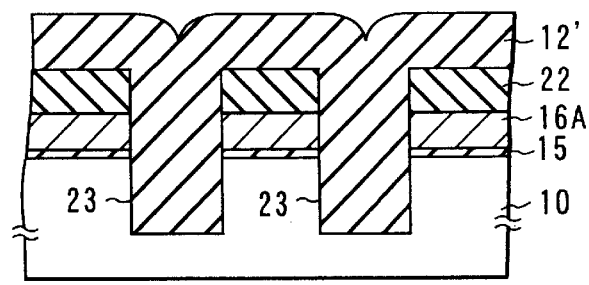
Figure 65:
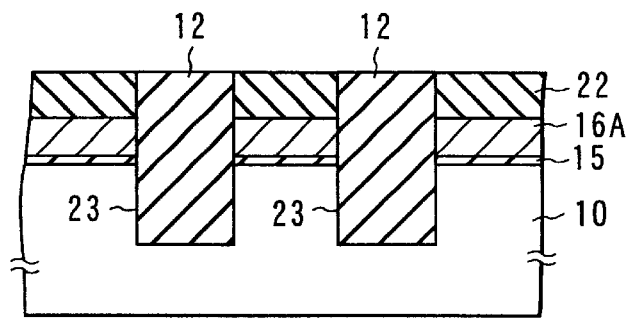
Figure 66:
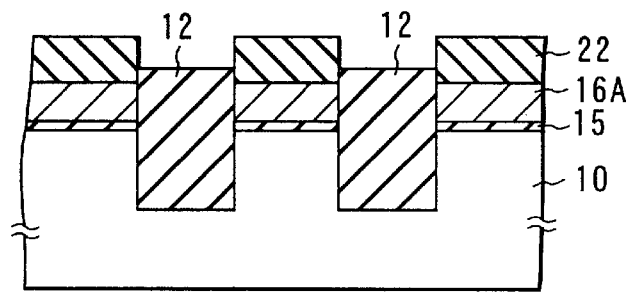
Figure 67:
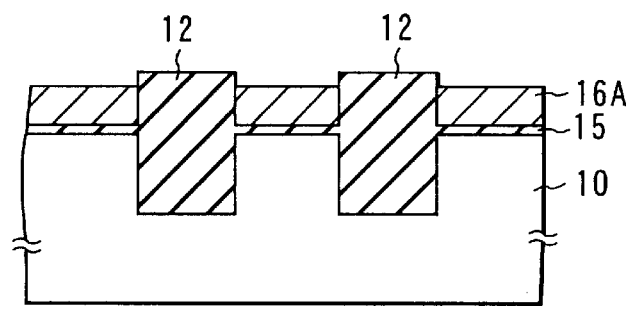
Figure 68:
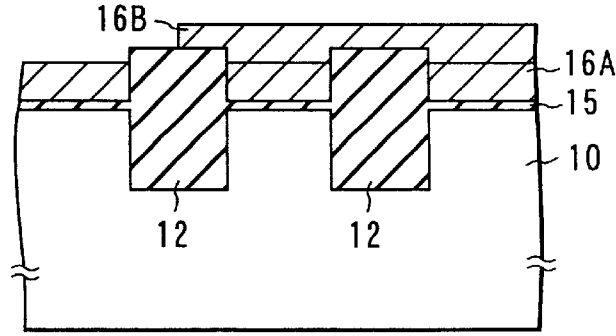

FIG. 29 and FIG. 30 show the shapes of the semiconductor devices according to twenty-second and twenty-third embodiments of the present invention.

This semiconductor device is each premised on the formation of a MOS capacitor, but, if two contact portions 19 associated with a silicon substrate 10 are connected to different wirings, respectively, then this semiconductor device can be made to function as a MOSFET.

In the embodiment shown in FIG. 29, the element region 11 has a concave shape, and the conductive film 16 has such a shape as not to cover the corners of the element region 11. The embodiment shown in FIG. 30 is a modification of the embodiment shown in FIG. 29, wherein portions of corners of the element region 11 are cut off.

The present invention can be applied to all semiconductor devices such as memory IC (DRAM, EEPROM), logic IC, that is, to semiconductor devices each comprising a conductive film formed striding over the element isolation region and, further, has in the element region 11 a capacitor structure comprised of a semiconductor substrate, an insulation layer, and a conductive film.

For example, in a memory IC, the present invention can be applied to MOSFET and MOS capacitors constituting peripheral circuits thereof. In this case, with respect to all the MOSFET and MOS capacitors in each of which the conductive film used as the gate electrode or capacitor electrode is formed striding over two mutually adjacent sides of the element region 11, the conductive film is made not to cover the corners which are the intersecting points of two mutually adjacent sides.

By so doing, the occurrence of breakdown in all the MOSFET and MOS capacitors which constitute peripheral circuits of a memory IC can be prevented, and thus, the reliability and the manufacturing yield of the memory IC can be enhanced.

In view of only the prevention of the inconvenience resulting from applying a voltage to the insulation film, mentionable significance do not lie in the application of the present invention to a dummy wiring arranged in such a manner that the silicon substrate and the conductive film are set to the same potential though it has a structure similar to the structures of the MOSFET or MOS capacitors according to the present invention. However, it does not matter at all even if the present invention is applied to such a dummy wiring for reasons relating to the manufacture.

As described above, the semiconductor device according to the present invention comprises a conductive film formed striding over an element isolation region and an element region 11 and, further, has in the element region 11 a capacitor structure comprised of a semiconductor substrate, an insulation layer and a conductive film, wherein the conduction has such a shape as not to cover any of the corners of the element region 11. Therefore, even if the corner portions of the element region 11 become thin or the film quality thereof is deteriorated, no breakdown due to the concentration of electric field is caused; and thus, the reliability and the manufacturing yield can be enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an element region having a polygonal shape which has a plurality of sides and a plurality of corners;
   an element isolation region surrounding the element region;
   an insulation film formed on the element region; and
   a conductive film formed on the insulation film, having such a shape as to cover two adjacent sides of the element region, and not to cover a corner which is an intersecting point of any of the two adjacent sides covered by the conductive film.

2. A semiconductor device according to claim 1, wherein the shape of the element region is square.

3. A semiconductor device according to claim 1, wherein the shape of the element region is rectangular.

4. A semiconductor device according to claim 1, wherein the shape of the element region is of L-shape.

5. A semiconductor device according to claim 1, wherein the shape of the element region is convex.

6. A semiconductor device according to claim 1, wherein the element isolation region has a LOCOS structure.

7. A semiconductor device according to claim 1, wherein the element isolation region has an STI structure.

8. A semiconductor device according to claim 1, wherein the conductive film is an electrode of a MOS capacitor.

9. A semiconductor device according to claim 1, wherein the conductive film is a gate electrode of a MOSFET.

10. A semiconductor device comprising:
    an element region having a ring shape which has a plurality of sides and a plurality of corners;
    an element isolation region surrounding the element region;
    an insulation film formed on the element region; and
    a conductive film formed on the insulation film, having such a shape as to cover two adjacent sides of the element region inside the ring shape and not to cover a corner which is an intersecting point of any of the two adjacent sides covered by the conductive film.

11. A semiconductor device according to claim 10, wherein the shape of the element region is square-like ring.

12. A semiconductor device according to claim 10, wherein the shape of the element region is rectangle-like ring.

13. A semiconductor device according to claim 10, wherein the element isolation region has a LOCOS structure.

14. A semiconductor device according to claim 10, wherein the element isolation region has an STI structure.

15. A semiconductor device according to claim 10, wherein the conductive film is an electrode of a MOS capacitor.

16. A semiconductor device according to claim 10, wherein the conductive film is a gate electrode of a MOSFET.

17. A semiconductor integrated circuit comprising:
    a semiconductor substrate; and
    a plurality of semiconductor elements formed on the semiconductor substrate, each of the semiconductor elements including:
    an element region having a polygonal shape which has a plurality of sides and a plurality of corners;
    an element isolation region surrounding the element region;
    an insulation film formed on the element region; and
    a conductive film formed on the insulation film, having such a shape as to cover two adjacent sides of the element region and not to cover a corner which is an intersecting point of any of the two adjacent sides covered by the conductive film.

18. A semiconductor device according to claim 17, wherein the shape of the element region is square.

19. A semiconductor device according to claim 17, wherein the shape of the element region is rectangular.

20. A semiconductor device according to claim 17, wherein the shape of the element region is of L-shape.

21. A semiconductor device according to claim 17, wherein the shape of the element region is convex.

22. A semiconductor device according to claim 17, wherein the element isolation region has a LOCOS structure.

23. A semiconductor device according to claim 17, wherein the element isolation region has an STI structure.

24. A semiconductor device according to claim 17, wherein the conductive film is an electrode of a MOS capacitor.

25. A semiconductor device according to claim 17, wherein the conductive film is a gate electrode of a MOSFET.

26. A semiconductor device according to claim 17, wherein the element regions are arranged in a matrix form.

27. A semiconductor integrated circuit comprising:
    a semiconductor substrate; and
    a plurality of semiconductor elements formed on the semiconductor substrate, each of the semiconductor elements including:
    an element region having a ring shape which has a plurality of sides and a plurality of corners;
    an element isolation region surrounding the element region;
    an insulation film formed on the element region; and
    a conductive film formed on the insulation film, having such a shape as to cover two adjacent sides of the element region inside the ring shape and not to cover a corner which is an intersecting point of any of the two adjacent sides covered by the conductive film.

28. A semiconductor device according to claim 27, wherein the shape of the element region is square-like ring.

29. A semiconductor device according to claim 27, wherein the shape of the element region is rectangle-like ring.

30. A semiconductor device according to claim 27, wherein the element isolation region has a LOCOS structure.

31. A semiconductor device according to claim 27, wherein the element isolation region has an STI structure.

32. A semiconductor device according to claim 27, wherein the conductive film is an electrode of a MOS capacitor.

33. A semiconductor device according to claim 27, wherein the conductive film is a gate electrode of a MOSFET.

34. A semiconductor device according to claim 27, wherein the element regions are arranged in a matrix form.

35. A semiconductor device comprising:
an element region formed on a semiconductor substrate, having a polygonal shape which has a plurality of sides and a plurality of corners;
an element isolation region surrounding the element region;
an insulation film formed on the element region; and
a conductive film formed on the insulation film, applied with a potential difference between the conductive film and the semiconductor substrate, having such a shape as to cover two adjacent sides of the element region, and not to cover a corner which is an intersecting point of any of the two adjacent sides covered by the conductive film.

36. A semiconductor device comprising:
an element region formed on a semiconductor substrate, having a ring shape which has a plurality of sides and a plurality of corners;
an element isolation region surrounding the element region;
an insulation film formed on the element region; and
a conductive film formed on the insulation film, applied with a potential difference between the conductive film and the semiconductor substrate, having such a shape as to cover two adjacent sides of the element region inside the ring shape and not to cover a corner which is an intersecting point of any of the two adjacent sides covered by the conductive film.

37. A semiconductor integrated circuit comprising:
a semiconductor substrate; and
a plurality of semiconductor elements formed on the semiconductor substrate, each of the semiconductor elements including:
an element region having a polygonal shape which has a plurality of sides and a plurality of corners;
an element isolation region surrounding the element region;
an insulation film formed on the element region; and
a conductive film formed on the insulation film, applied with a potential difference between the conductive film and the semiconductor substrate, having such a shape as to cover two adjacent sides of the element region and not to cover a corner which is an intersecting point of any of the two adjacent sides covered by the conductive film.

38. A semiconductor integrated circuit comprising:
semiconductor substrate; and
a plurality of semiconductor elements formed on the semiconductor substrate, each of the semiconductor elements including:
an element region having a ring shape which has a plurality of sides and a plurality of corners;
an element isolation region surrounding the element region;
an insulation film formed on the element region; and
a conductive film formed on the insulation film, applied with a potential difference between the conductive film and the semiconductor substrate, having such a shape as to cover two adjacent sides of the element region inside the ring shape and not to cover a corner which is an intersecting point of any of the two adjacent sides covered by the conductive film.

39. A semiconductor device according to claim 1, wherein said semiconductor device is a memory IC.

40. A semiconductor device according to claim 1, wherein said semiconductor device is selected from the group consisting of: DRAM, EEPROM, and a logic IC.

41. A semiconductor device according to claim 10, wherein said semiconductor device is a memory IC.

42. A semiconductor device according to claim 10, wherein said semiconductor device is selected from the group consisting of, DRAM, EEPROM, and a logic IC.

43. A semiconductor integrated circuit according to claim 17, wherein said semiconductor integrated circuit is a memory IC.

44. A semiconductor integrated circuit according to claim 17, wherein said semiconductor integrated circuit is selected from the group consisting of: DRAM, EEPROM, and a logic IC.

45. A semiconductor integrated circuit according to claim 27, wherein said semiconductor integrated circuit is a memory IC.

46. A semiconductor integrated circuit according to claim 27, wherein said semiconductor integrated circuit is selected from the group consisting of: DRAM, EEPROM, and a logic IC.

47. A semiconductor device according to claim 35, wherein said semiconductor device is a memory IC.

48. A semiconductor device according to claim 35, wherein said semiconductor device is selected from the group consisting of: DRAM, EEPROM, and a logic IC.

49. A semiconductor device according to claim 36, wherein said semiconductor device is a memory IC.

50. A semiconductor device according to claim 36, wherein said semiconductor device is selected from the group consisting of: DRAM, EEPROM, and a logic IC.

51. A semiconductor integrated circuit according to claim 37, wherein said semiconductor device is a memory IC.

52. A semiconductor integrated circuit according to claim 37, wherein said semiconductor device is selected from the group consisting of: DRAM, EEPROM, and a logic IC.

53. A semiconductor integrated circuit according to claim 38, wherein said semiconductor device is a memory IC.

54. A semiconductor integrated circuit according to claim 38, wherein said semiconductor device is selected from the group consisting of: DRAM, EEPROM, and a logic IC.

* * * * *